United States Patent
Ozaki et al.

(10) Patent No.: US 7,297,558 B2
(45) Date of Patent: Nov. 20, 2007

(54) METHOD OF MANUFACTURING SEMICONDUCTOR DEVICE

(75) Inventors: Yasutaka Ozaki, Kawasaki (JP);
Tatsuya Yokota, Kawasaki (JP);
Nobutaka Ohyagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 210 days.

(21) Appl. No.: 11/106,580

(22) Filed: Apr. 15, 2005

(65) Prior Publication Data
US 2005/0181605 A1 Aug. 18, 2005

(51) Int. Cl.
*H01L 21/00* (2006.01)

(52) U.S. Cl. .......................... 438/3; 438/133; 438/680; 438/683; 257/E21.17; 257/E21.304; 257/E21.663; 257/E21.664

(58) Field of Classification Search .................... 438/3, 438/133, 197, 238, 381, 680, 692, 687, 688, 438/683, 684, 724, 757, 663, 673, 672, 744, 438/769
See application file for complete search history.

(56) References Cited

U.S. PATENT DOCUMENTS

| 5,185,689 | A | * | 2/1993 | Maniar ........................ 361/313 |
| 5,241,211 | A | * | 8/1993 | Tashiro ........................ 257/506 |
| 5,986,301 | A | * | 11/1999 | Fukushima et al. ......... 257/306 |
| 2003/0011002 | A1 | | 1/2003 | Takaura et al. | |

FOREIGN PATENT DOCUMENTS

| JP | 04323821 A | 11/1992 |
| JP | 11133457 A | 5/1999 |
| JP | 2001-044376 A | 2/2001 |
| JP | 2001-068648 A | 3/2001 |
| KR | 1998-036487 A | 8/1998 |
| KR | 1998-086199 A | 12/1998 |
| KR | 10-2003-0023143 A | 3/2003 |
| KR | 2003-0023143 A | 3/2003 |

* cited by examiner

*Primary Examiner*—David Nhu
(74) *Attorney, Agent, or Firm*—Arent Fox LLP

(57) ABSTRACT

A W plug (24) is formed and a W oxidation preventing barrier metal film (25) is formed thereon. After that, an SiON film (27) thinner than the W oxidation preventing barrier metal film (25) is formed and Ar sputter etching is performed on the SiON film (27). As a result, the shape of the surface of the SiON film (27) becomes gentler and deep trenches disappear. Next, an SiON film (28) is formed on the whole surface. A voidless W oxidation preventing insulating film (29) is composed of the SiON (28) film and the SiON film (27).

18 Claims, 37 Drawing Sheets

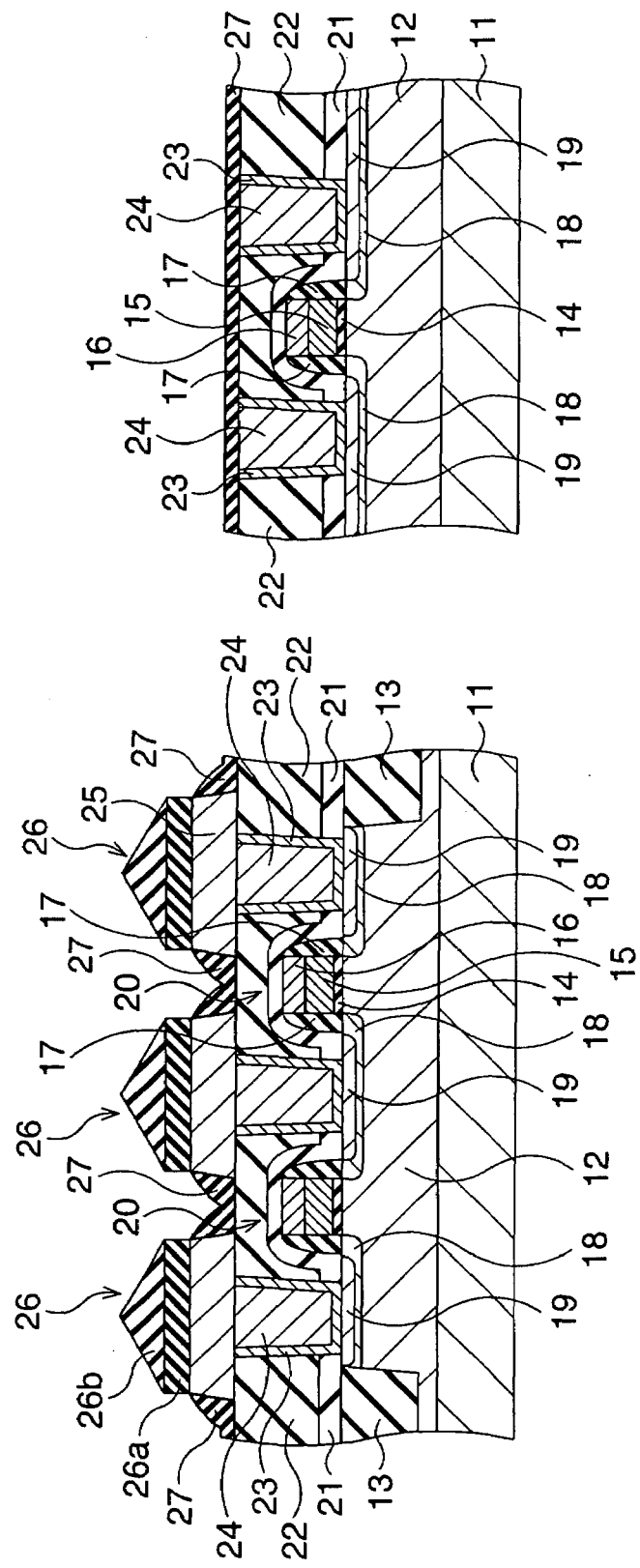

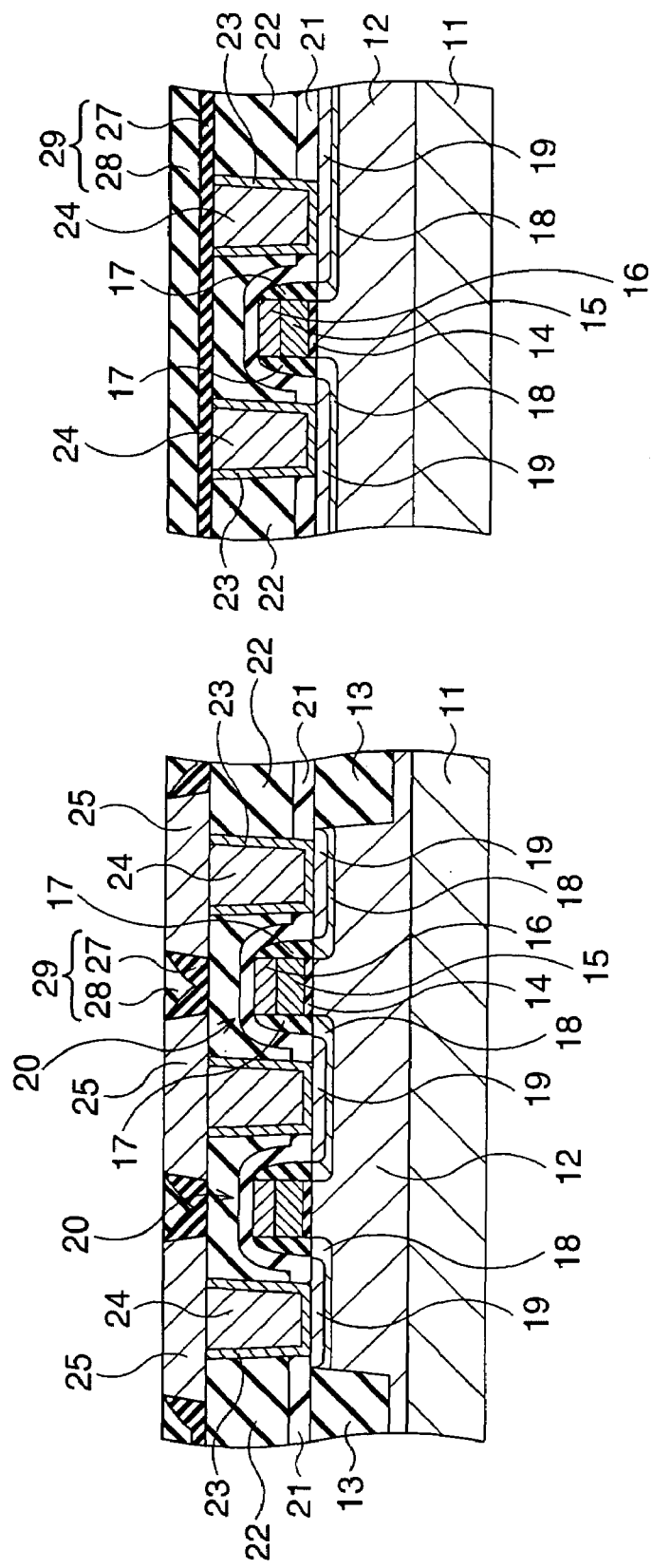

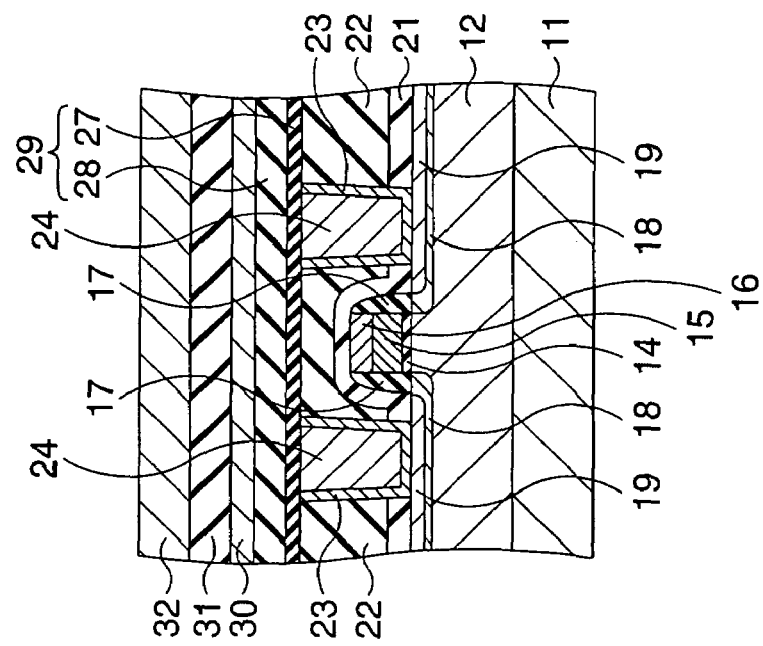
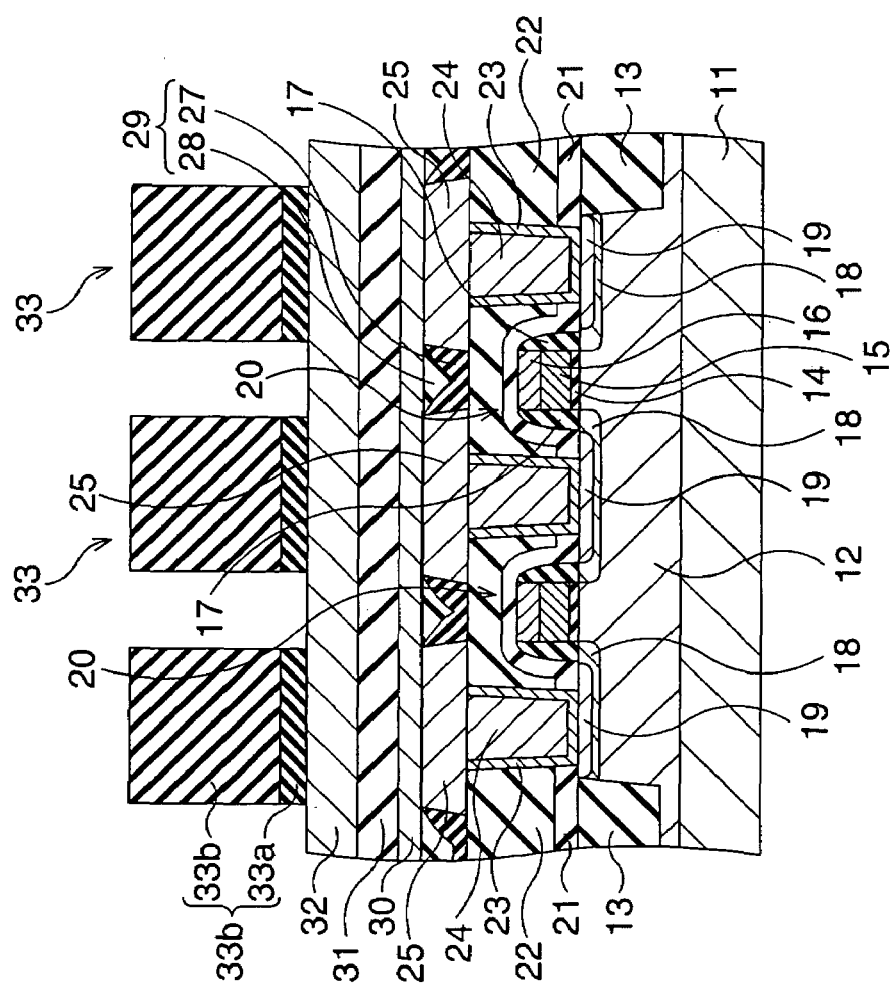
FIG. 20A
FIG. 20B

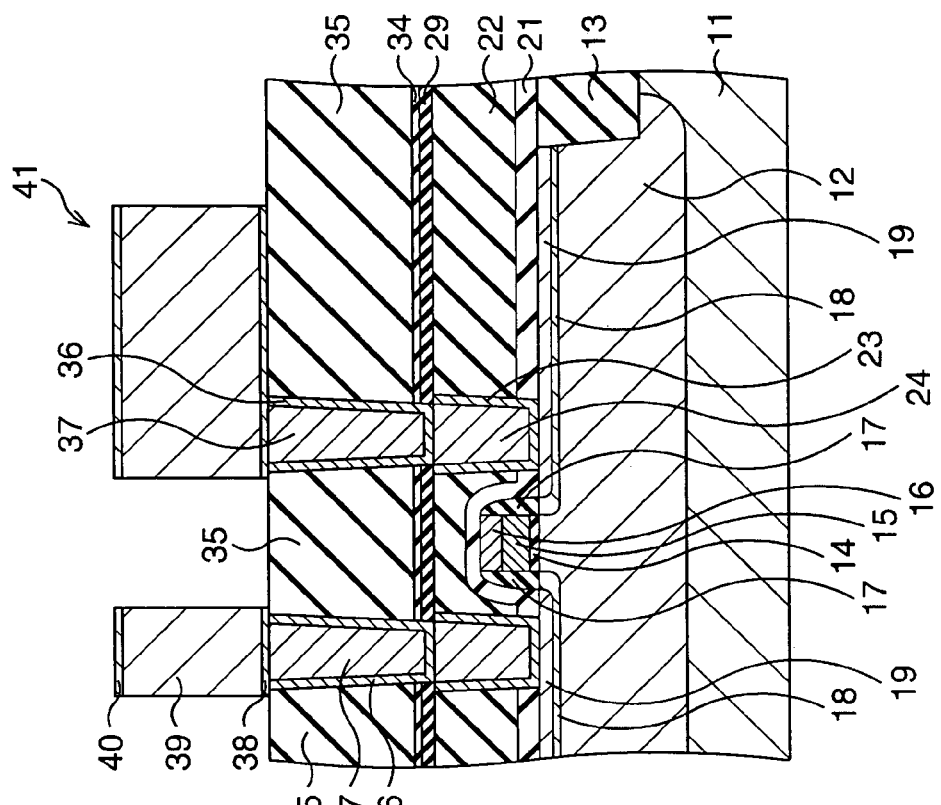
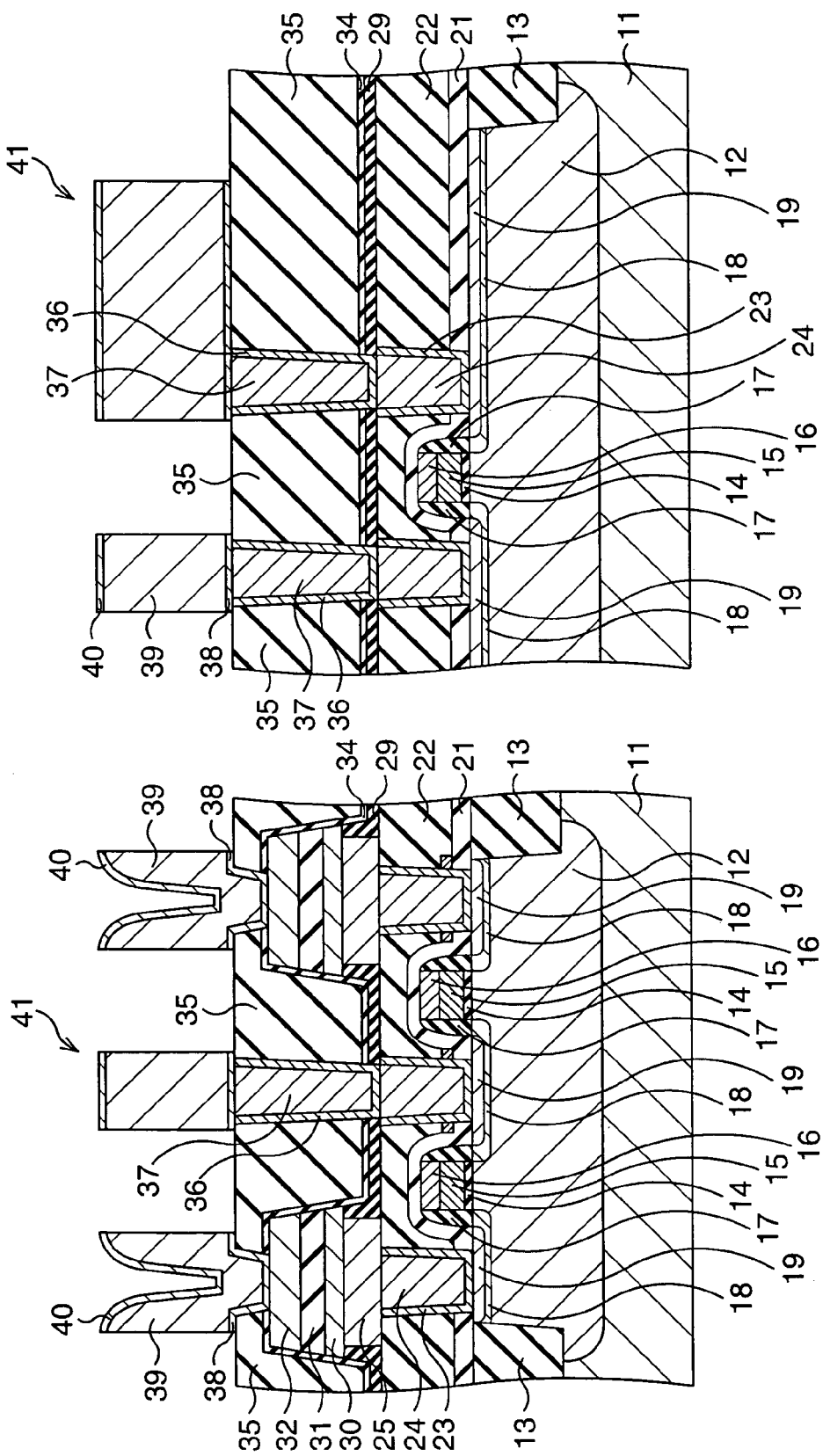
FIG. 23A
FIG. 23B

FIG. 32A
FIG. 32B
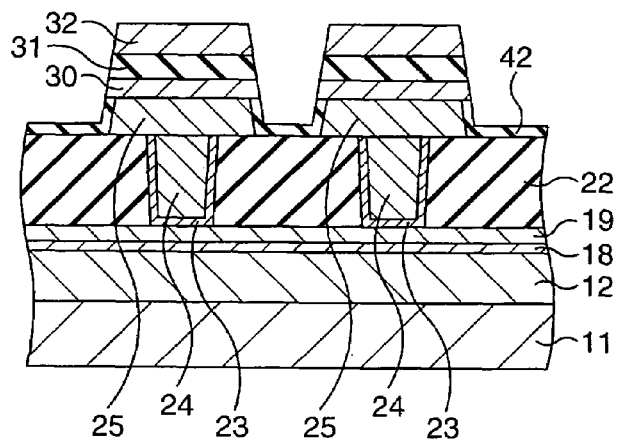
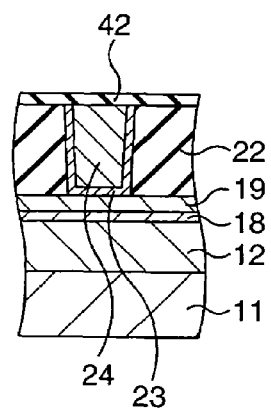
FIG. 33A
FIG. 33B
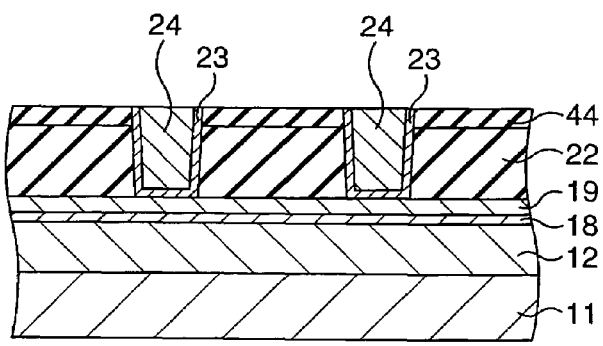
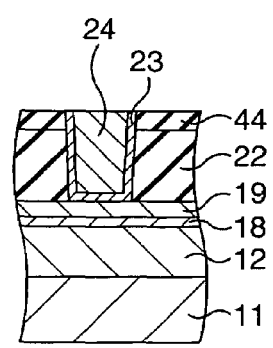

FIG. 34A
FIG. 34B
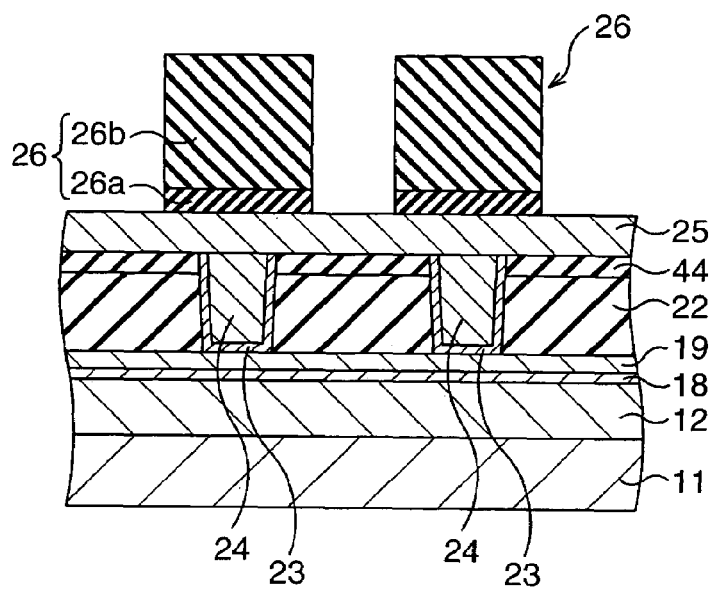
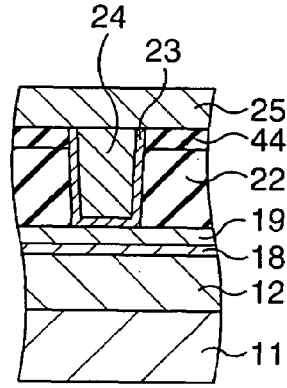
FIG. 35A
FIG. 35B
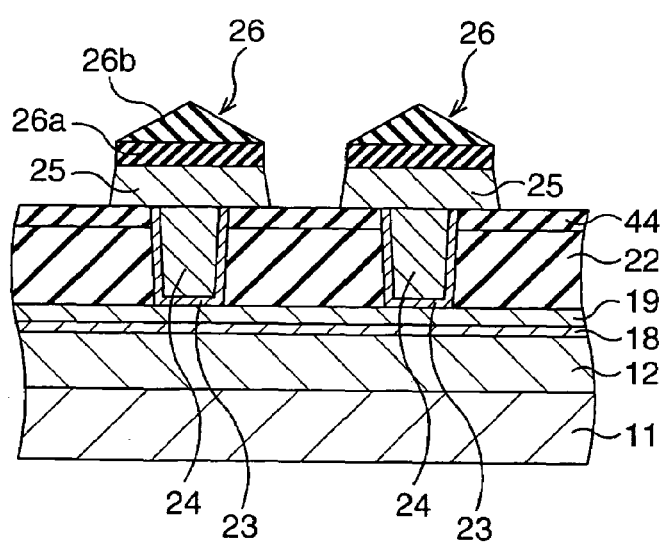
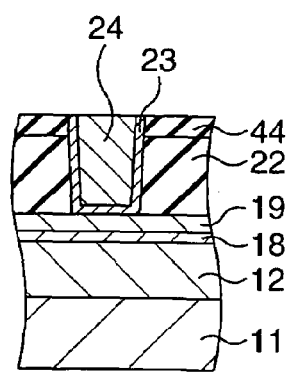

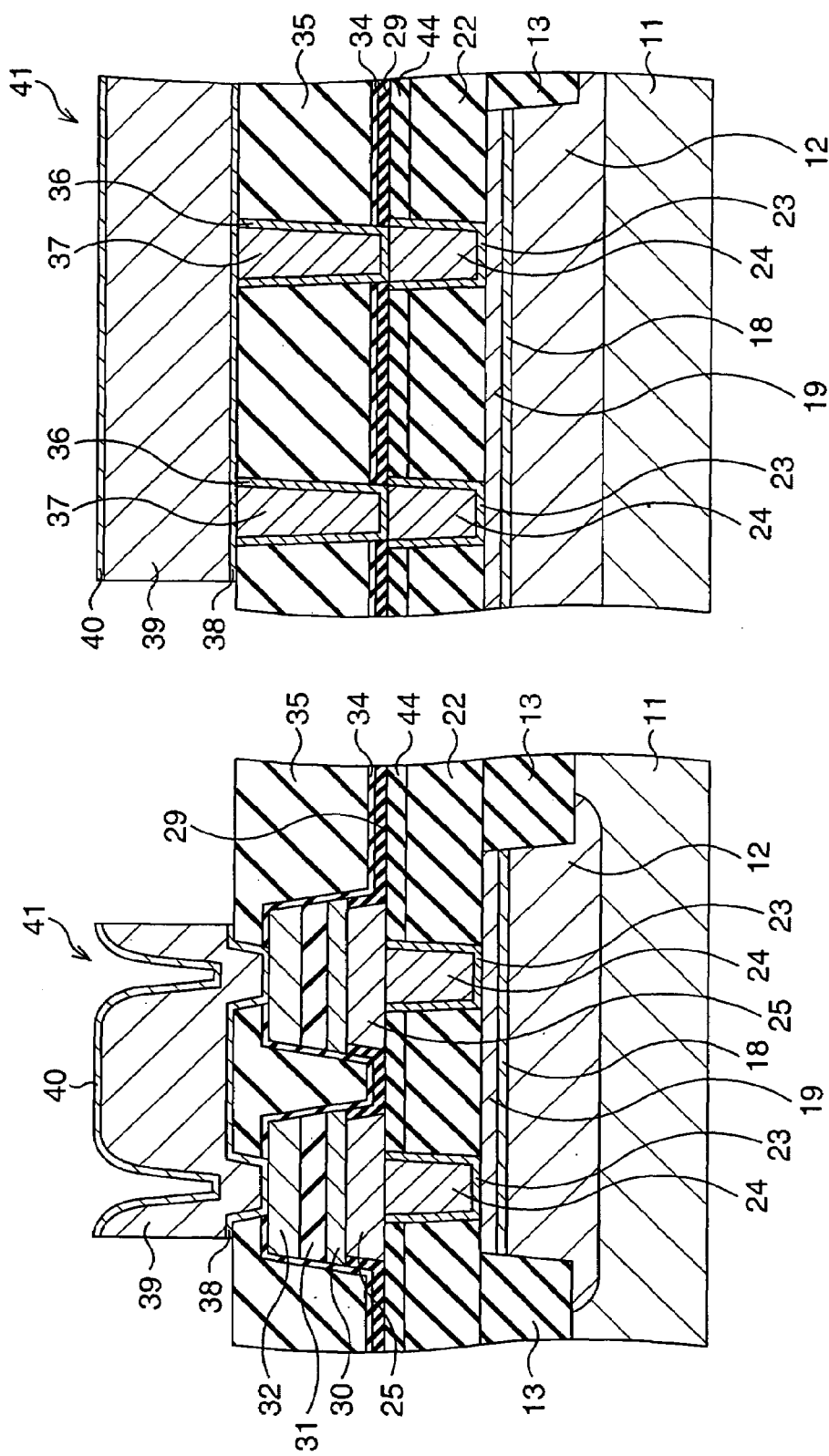

FIG. 53A
FIG. 53B
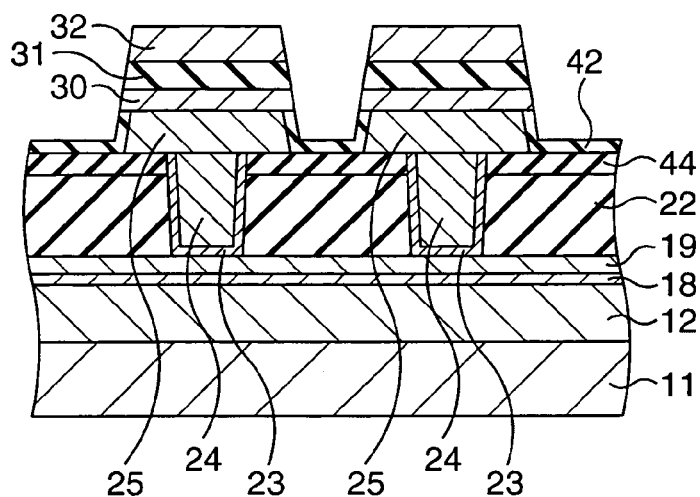
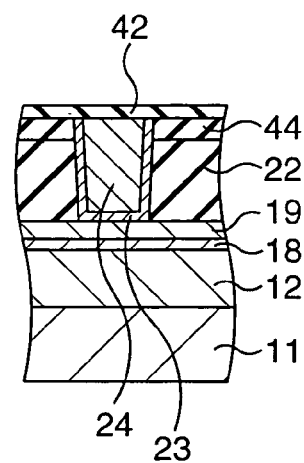

METHOD OF MANUFACTURING SEMICONDUCTOR DEVICE

TECHNICAL FIELD

The present invention relates to a method of manufacturing a semiconductor device suitable for the manufacturing of a ferroelectric memory.

BACKGROUND ART

A ferroelectric random access memory (FeRAM) is used as a non-volatile semiconductor memory. The structures of ferroelectric capacitors provided in a ferroelectric memory are broadly classified into the stack structure and the planar structure, and it is ferroelectric capacitors of planar structure that are mass-produced today.

In contrast, from requests for higher packing densities, it is demanded that capacitors of stack construction capable of reducing the cell area be put to practical use. In the stack structure, immediately under a bottom electrode of a ferroelectric capacitor there is provided a contact plug to ensure conduction with a substrate (a diffusion layer). As disclosed in the Japanese Patent Application Laid-Open No. 2001-44376, tungsten or polysilicon is generally used as the material for this contact plug. The contact resistance of a W plug is usually 2 to 3 $\Omega$, whereas the contact resistance of a plug formed from polysilicon is 1 to 2 k$\Omega$.

A ferroelectric memory is often mounted together with a logic circuit. For example, a security-related chip that requires certification and an IC card are examples. In a logic circuit, usually a W plug is used. Therefore, also in a simulation performed in designing a logic circuit, the resistance value of a W plug is used as a parameter.

Therefore, to use equipment and techniques that have hitherto been used and to suppress an increase in the number of development steps and in cost, it is desirable to use a W plug as in the past in a logic part of a ferroelectric memory that is to be mounted together with a logic circuit.

Usually, in forming a ferroelectric capacitor, various kinds of heat treatment, such as crystallization annealing and recovery annealing, are necessary for obtaining good characteristics. For example, crystallization annealing is RTA (rapid thermal annealing) at 750° C. for 60 seconds and recovery annealing is furnace annealing at 650° C. for 60 minutes.

However, a W plug has the property of oxidizing at a very high speed and at a low temperature. When oxidation occurs in a part of a W plug once, the oxidation spreads over the whole plug. Therefore, contact defects are apt to occur and yields are apt to decrease. In order to suppress the oxidation of a W plug, it is desirable to lower the annealing temperature.

Thus, various kinds of annealing are required in order to improve the performance of a ferroelectric capacitor, whereas it is necessary to lower the annealing temperature to a somewhat low level in order to prevent an increase in the contact resistance of a W plug immediately under the capacitor. That is, under present circumstances, the performance of a ferroelectric capacitor and the contact performance of a W plug are in a trade-of relation.

Conventionally, after the formation of a ferroelectric capacitor, a contact hole between a bit line of a ferroelectric memory and a substrate is formed by performing etching once. The reason why a contact hole is formed after the formation of a ferroelectric capacitor is that in a case where a contact hole is formed before the formation of a ferroelectric capacitor and a W plug is embedded, the W plug may be oxidized during the formation of the ferroelectric capacitor.

However, when scaling down is promoted in the future, the aspect ratio of a contact hole increases, with the result that etching during the formation of a contact hole, embedding a glue film in a contact hole and the like become difficult.

[Patent Document 1]
Japanese Patent Application Laid-Open No. 2001-44376
[Patent Document 2]
Japanese Patent Application Laid-Open No. 4-323821
[Patent Document 3]
Japanese Patent Application Laid-Open No. 11-133457

SUMMARY OF THE INVENTION

The object of the present invention is to provide a method of manufacturing a semiconductor device capable of suppressing an increase in contact resistance even when the annealing temperature is raised.

In a first method of manufacturing a semiconductor device according to the present invention, first, a switching element is formed on a surface of a semiconductor substrate. Next, an interlayer dielectric film that covers the switching element is formed. Subsequently, in the interlayer dielectric film, a contact hole that reaches a conductive layer of the switching element is formed. After that, a contact plug is embedded in the contact hole. Subsequently, on the interlayer dielectric film, a barrier metal film connected to the contact plug is selectively formed. Next, a first insulating film is formed on the whole surface. Subsequently, a surface slope of the first insulating film is made gentler by performing sputter etching on the first insulating film. And a ferroelectric capacitor is formed on the barrier metal film.

In a second method of manufacturing a semiconductor device according to the present invention, first, a switching element is formed on a surface of a semiconductor substrate. Next, an interlayer dielectric film that covers the switching element is formed. Subsequently, in the interlayer dielectric film, a contact hole that reaches a conductive layer of the switching element is formed. After that, a contact plug is embedded in the contact hole. Subsequently, on the interlayer dielectric film, a barrier metal film connected to the contact plug is selectively formed. Next, an insulating film thicker than the barrier metal film is formed on the whole surface by a high-density plasma process. And a ferroelectric capacitor is formed on the barrier metal film.

BRIEF DESCRIPTION OF THE DRAWINGS

FIGS. 17A and 17B are each a sectional view that shows a method of manufacturing a ferroelectric memory in a step after the step shown in FIGS. 16A and 16B according to the first embodiment of the present invention;

FIGS. 19A and 19B are each a sectional view that shows a method of manufacturing a ferroelectric memory in a step after the step shown in FIGS. 18A and 18B according to the first embodiment of the present invention;

FIGS. 20A and 20B are each a sectional view that shows a method of manufacturing a ferroelectric memory in a step after the step shown in FIGS. 19A and 19B according to the first embodiment of the present invention;

FIGS. 23A and 23B are each a sectional view that shows a method of manufacturing a ferroelectric memory in a step after the step shown in FIGS. 22A and 22B according to the first embodiment of the present invention;

FIGS. 32A and 32B are each a sectional view that shows a method of manufacturing a ferroelectric memory in a step after the step shown in FIGS. 31A and 31B according to the second embodiment of the present invention;

FIGS. 33A and 33B are each a sectional view that shows a method of manufacturing a ferroelectric memory according to a third embodiment of the present invention;

FIGS. 34A and 34B are each a sectional view that shows a method of manufacturing a ferroelectric memory in a step after the step shown in FIGS. 33A and 33B according to the third embodiment of the present invention;

FIGS. 35A and 35B are each a sectional view that shows a method of manufacturing a ferroelectric memory in a step after the step shown in FIGS. 34A and 34B according to the third embodiment of the present invention;

FIGS. 43A and 43B are each a sectional view that shows a method of manufacturing a ferroelectric memory in a step after the step shown in FIGS. 42A and 42B according to the third embodiment of the present invention;

FIGS. 53A and 53B are each a sectional view that shows a method of manufacturing a ferroelectric memory in a step after the step shown in FIGS. 52A and 52B according to the fourth embodiment of the present invention;

DETAILED DESCRIPTION OF THE PREFERRED EMBODIMENTS

Figure 1:
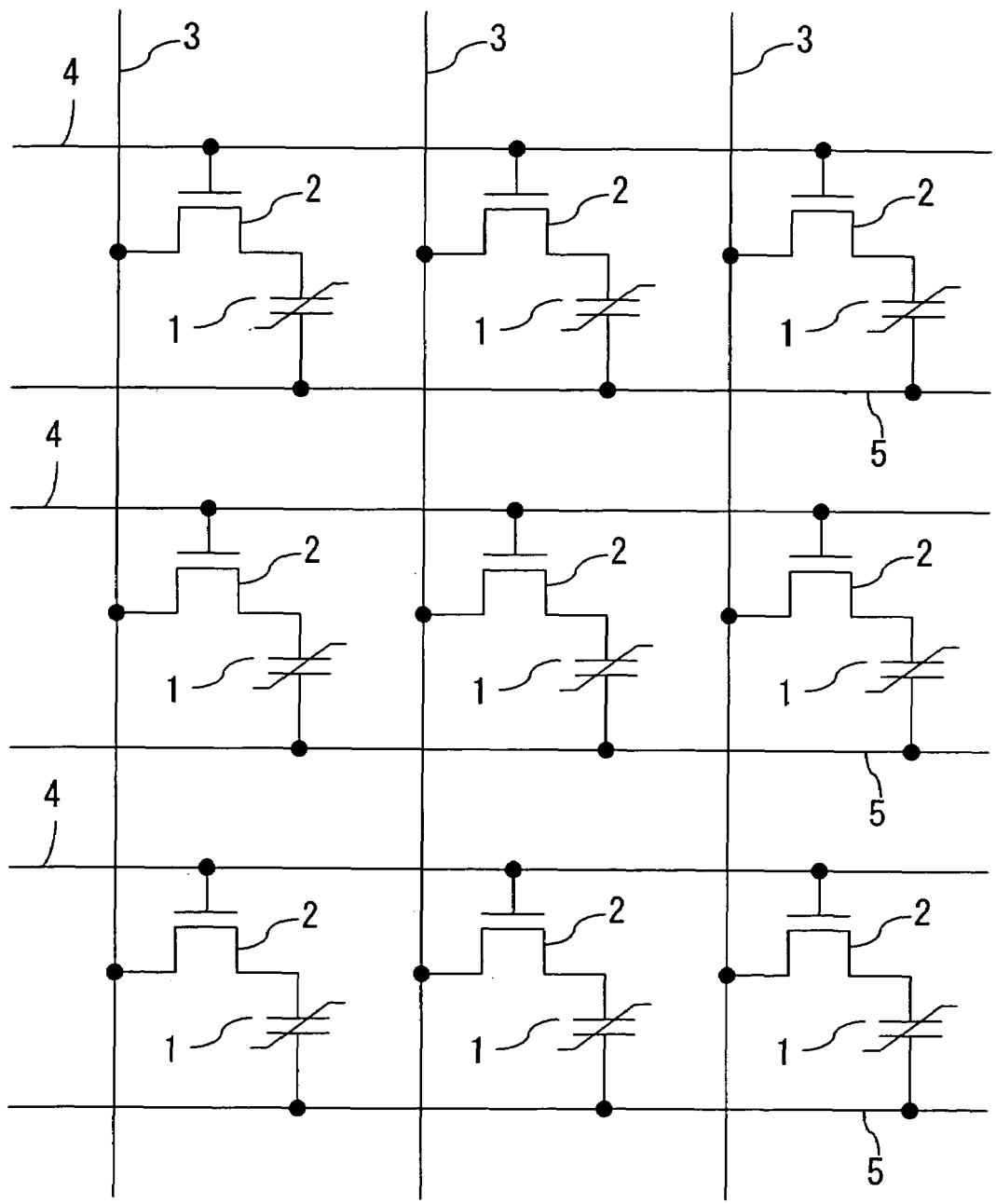
FIG. 1 is a circuit diagram that shows the construction of a memory cell array of a ferroelectric memory (semiconductor device) manufactured by a method according to an embodiment of the present invention.
Figure 2A:
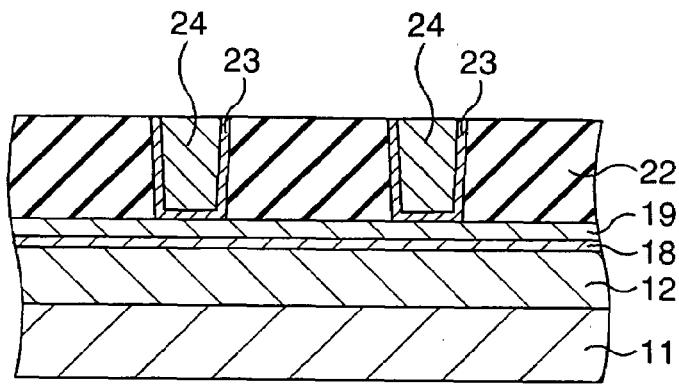
FIGS. 2A and 2B are each a sectional view that shows a method of manufacturing a ferroelectric memory according to a first embodiment of the present invention.
Figure 2B:
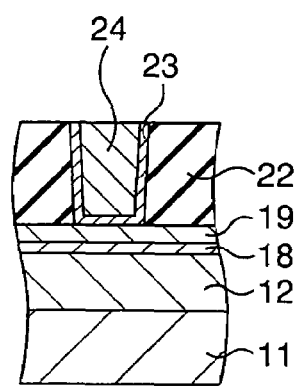
Figure 3A:
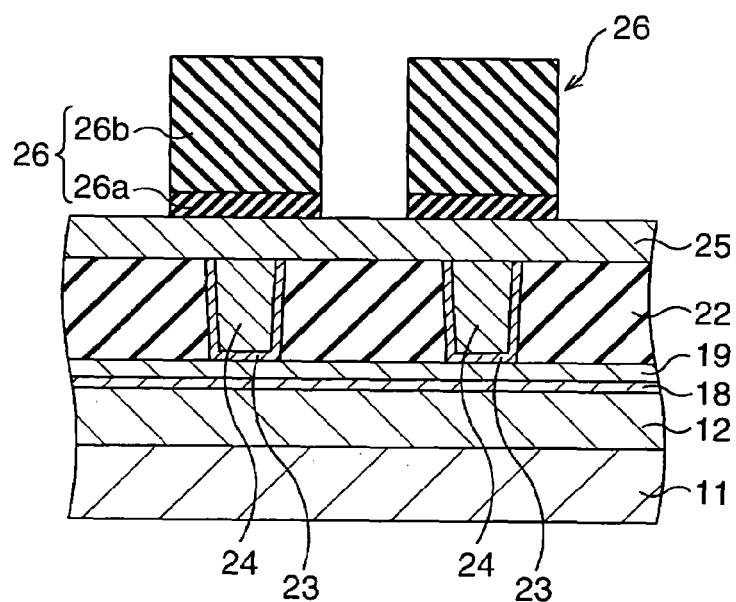
FIGS. 3A and 3B are each a sectional view that shows a method of manufacturing a ferroelectric memory in a step after the step shown in FIGS. 2A and 2B according to the first embodiment of the present invention.
Figure 3B:
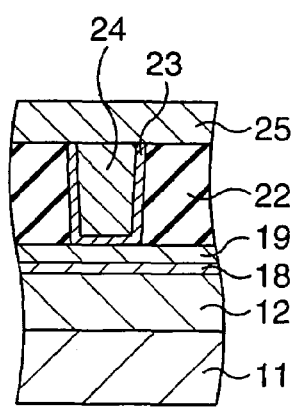
Figure 4A:
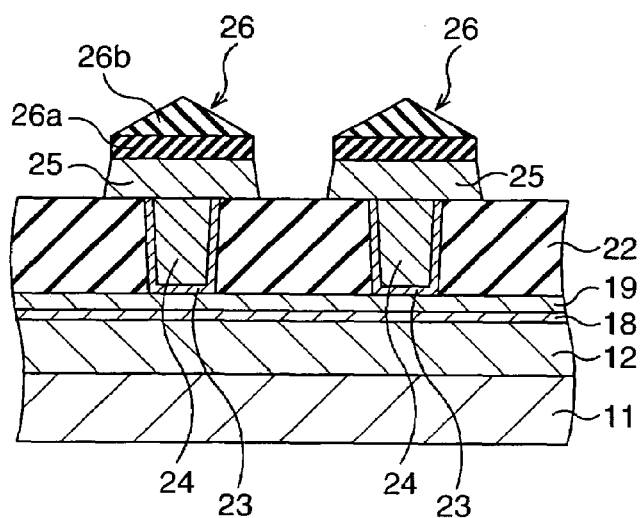
FIGS. 4A and 4B are each a sectional view that shows a method of manufacturing a ferroelectric memory in a step after the step shown in FIGS. 3A and 3B according to the first embodiment of the present invention.
Figure 4B:
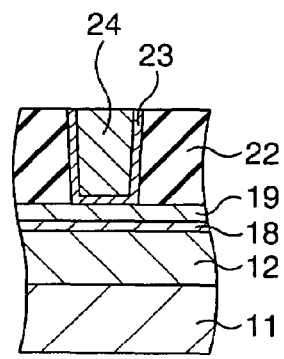
Figure 5A:
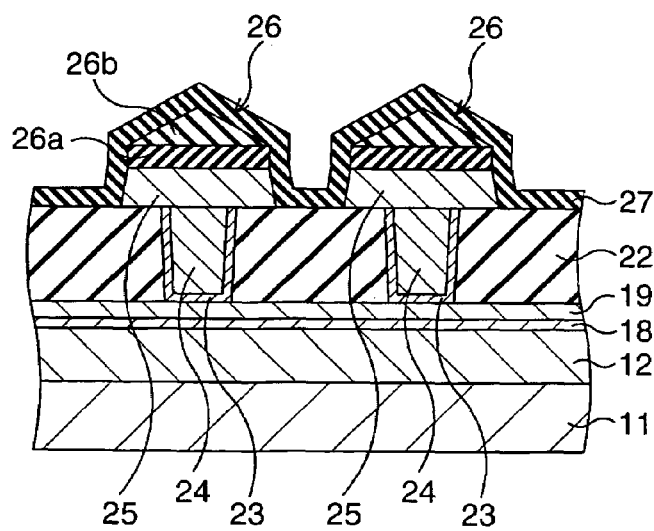
FIGS. 5A and 5B are each a sectional view that shows a method of manufacturing a ferroelectric memory in a step after the step shown in FIGS. 4A and 4B according to the first embodiment of the present invention.
Figure 5B:
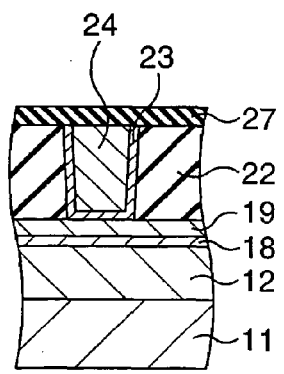
Figure 6A:
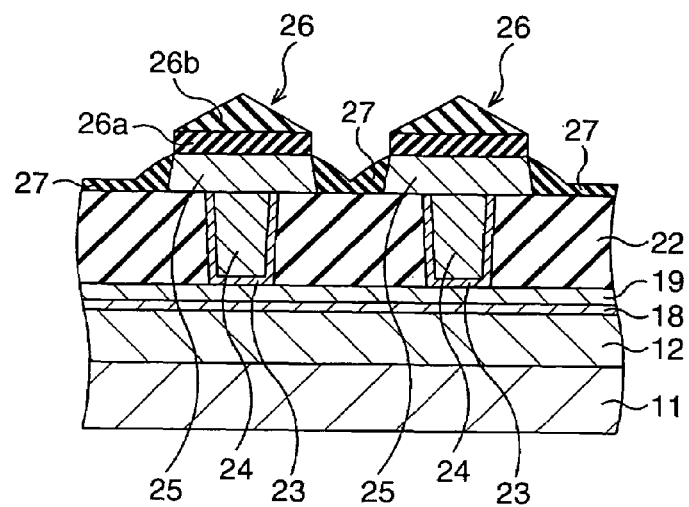
FIGS. 6A and 6B are each a sectional view that shows a method of manufacturing a ferroelectric memory in a step after the step shown in FIGS. 5A and 5B according to the first embodiment of the present invention.
Figure 6B:
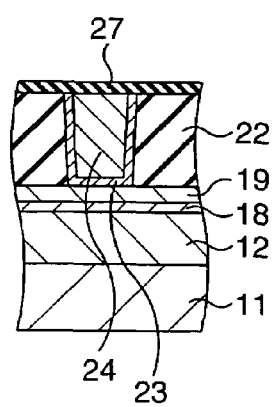
Figure 7A:
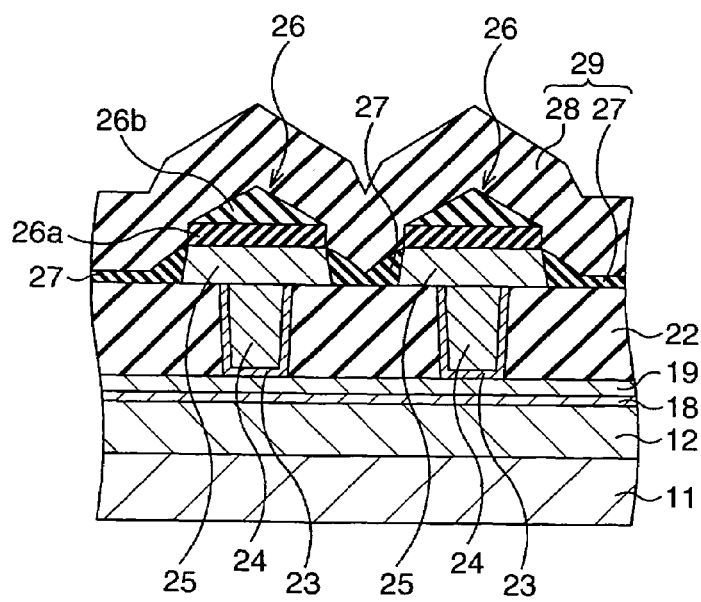
FIGS. 7A and 7B are each a sectional view that shows a method of manufacturing a ferroelectric memory in a step after the step shown in FIGS. 6A and 6B according to the first embodiment of the present invention.
Figure 7B:
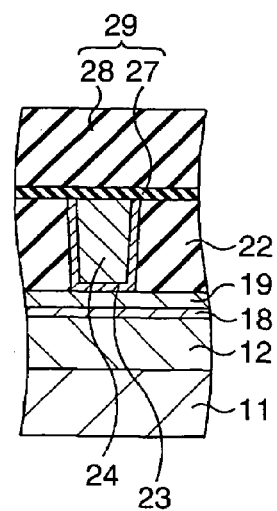
Figure 8A:
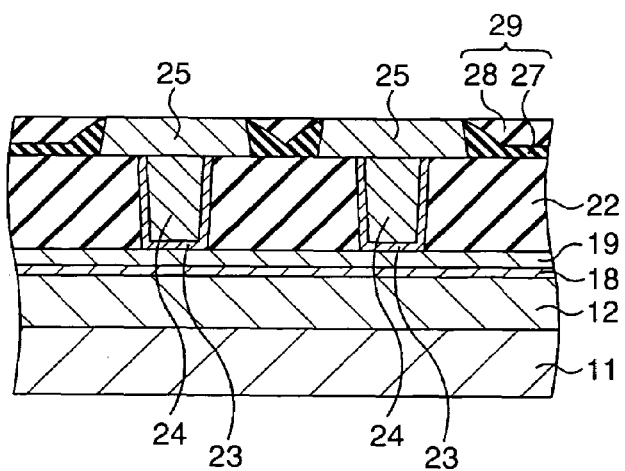
FIGS. 8A and 8B are each a sectional view that shows a method of manufacturing a ferroelectric memory in a step after the step shown in FIGS. 7A and 7B according to the first embodiment of the present invention.
Figure 8B:
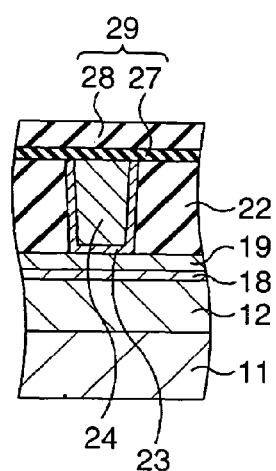
Figure 9A:
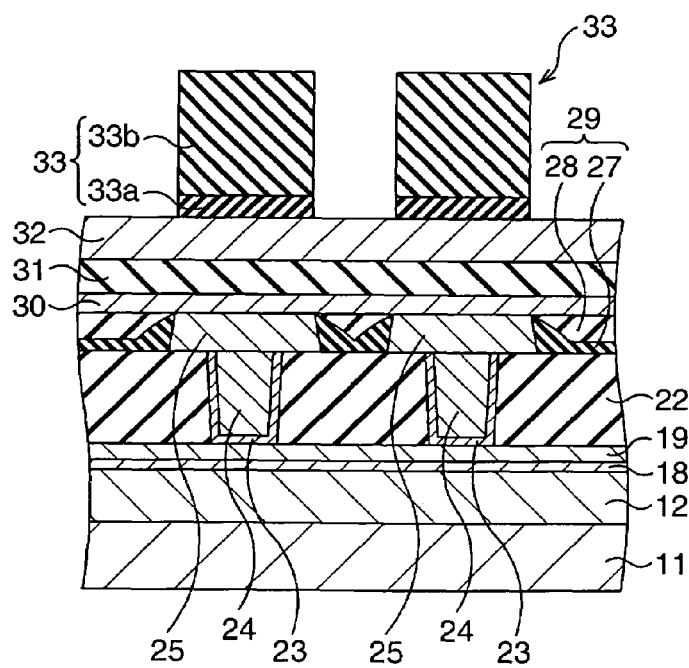
FIGS. 9A and 9B are each a sectional view that shows a method of manufacturing a ferroelectric memory in a step after the step shown in FIGS. 8A and 8B according to the first embodiment of the present invention.
Figure 9B:
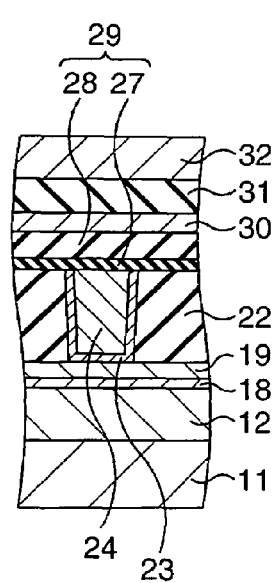
Figure 10A:
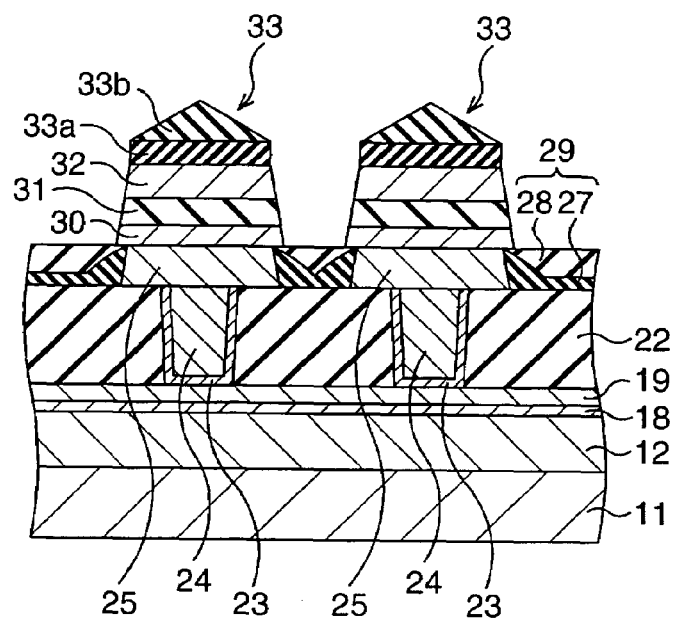
FIGS. 10A and 10B are each a sectional view that shows a method of manufacturing a ferroelectric memory in a step after the step shown in FIGS. 9A and 9B according to the first embodiment of the present invention.
Figure 10B:
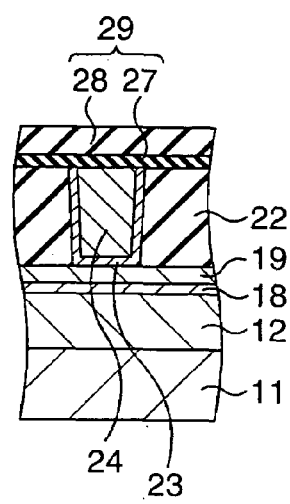
Figure 11A:
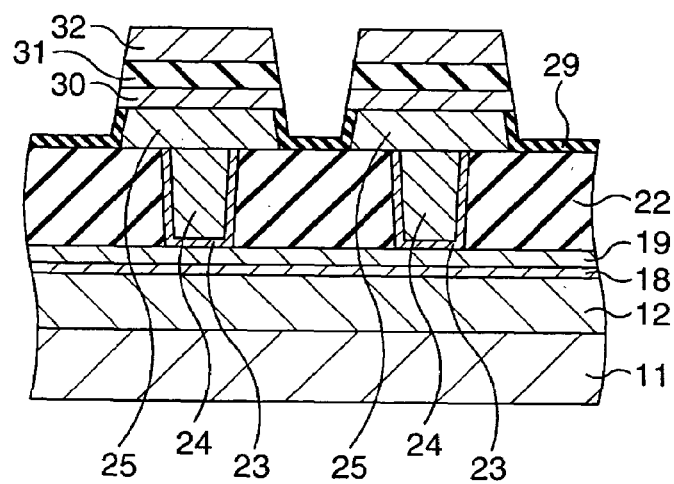
FIGS. 11A and 11B are each a sectional view that shows a method of manufacturing a ferroelectric memory in a step after the step shown in FIGS. 10A and 10B according to the first embodiment of the present invention.
Figure 11B:
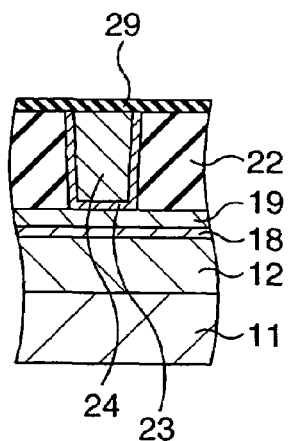

Embodiments of the present invention will be concretely described by referring to the accompanying drawings. FIG. 1 is a circuit diagram that shows the construction of a memory cell array of a ferroelectric memory (semiconductor device) manufactured by a method according to an embodiment of the present invention.

This memory cell array is provided with a plurality of bit lines 3 extending in one direction and a plurality of word lines 4 and plate lines 5 extending in the direction perpendicular to the direction in which the bit lines 3 extend. A plurality of memory cells of ferroelectric memory are arranged in array form in such a manner as to be aligned with lattices constituted by these bit lines 3, word lines 4 and plate lines 5. Each memory cell is provided with a ferroelectric capacitor 1 and a MOS transistor 2.

The gate of the MOS transistor 2 is connected to the word line 4. One source-drain of the MOS transistor 2 is connected to the bit line 3 and the other source-drain is connected to one electrode of the ferroelectric capacitor 1. And the other electrode of the ferroelectric capacitor 1 is connected to the plate line 5. Incidentally, each of the word lines 4 and plate lines 5 is shared by the MOS transistors 2 arranged in the same direction as the direction in which the word lines 4 and plate lines 5 extend. Similarly, each of the bit lines 3 is shared by the MOS transistors 2 arranged in the same direction as the direction in which the bit lines 3 extend. The direction in which the word lines 4 and plate lines 5 extend and the direction in which the bit lines 3 extend may sometimes be called the row direction and the column direction, respectively.

In the memory cell array of a ferroelectric memory constructed in this way, data is stored according to the polarization state of a ferroelectric film provided in the ferroelectric capacitor 1.

REFERENCE EXAMPLE

Figure 54B:
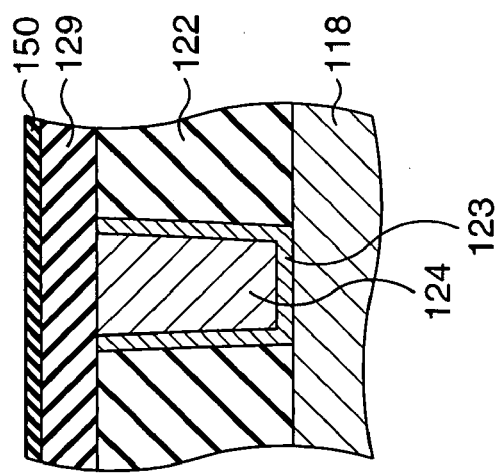
FIGS. 54A and 54B are each a sectional view that shows a method of manufacturing a semiconductor device according to a reference example.
Figure 54A:
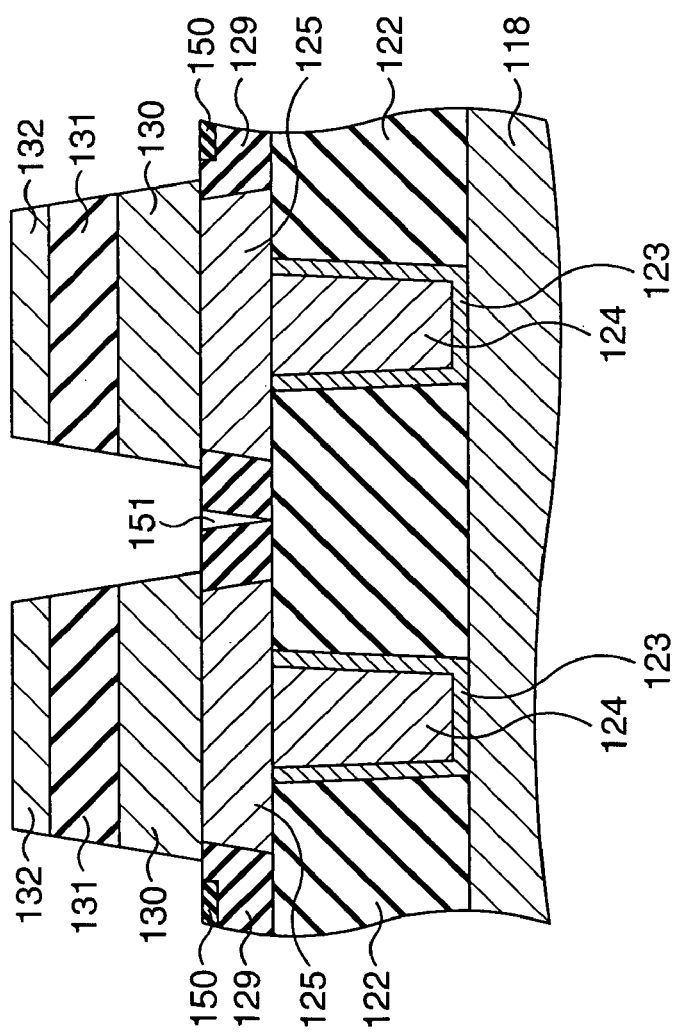

A reference example used in the process of making the present invention will be described here. FIGS. 54A and 54B are each a sectional view that shows a method of manufacturing a semiconductor device according to the reference example. FIGS. 54A and 54B each show a section perpendicular to the direction in which the bit lines 3 extend. FIG. 54A shows the section of a memory cell array part of a ferroelectric memory and FIG. 54B shows the section of a logic part (theoretical circuit part).

In the reference example, first, a MOS transistor (not shown) provided with a source-drain diffusion layer 118 is formed on the surface of a semiconductor substrate (not shown). Next, a silicon oxide film 122 is formed in such a manner as to cover the MOS transistor and the silicon oxide film 122 is planarized by CMP (chemical mechanical polishing) or the like. After that, by forming a contact hole that reaches each source-drain diffusion layer 118 in the silicon oxide film 122, a plug contact part is opened. And after the formation of a glue film 123 in the contact hole, a W film is embedded by a CVD process, for example, and planarization is performed by CMP, whereby a W plug 124 is formed. Subsequently, an Ir film 125 is formed on the whole surface as a W oxidation preventing barrier metal film. After that, the Ir film 125 is patterned with using a hard mask. Subsequently, a W oxidation preventing insulating film 129 and a capacitor adhesive insulating film 150 are formed in this order on the whole surface, and by polishing the capacitor insulating adhesive film 150, the W oxidation preventing insulating film 129 and the Ir film 125 by CMP, the Ir film 125 having a prescribed thickness is caused to remain and the capacitor adhesive insulating film 150 is caused to remain on the W oxidation preventing insulating film 129. The W oxidation preventing insulating film 129 is, for example, a plasma SiON film and the capacitor adhesive insulating film 150 is, for example, a TESO (tetraethylorthosilicate) film.

Next, a bottom electrode film 130, a ferroelectric film 131 and a top electrode film 132 are formed in this order and a ferroelectric capacitor is formed by simultaneously patterning these films. Incidentally, the capacitor adhesive insulating film 150 is formed to prevent the exfoliation of the bottom electrode film 130. Subsequently, a ferroelectric memory is completed by forming an interlayer dielectric film (not shown) and so on.

According to this manufacturing method, even when high-temperature annealing is performed during the formation of a ferroelectric capacitor, the W plug 124 is not apt to be oxidized due to the Ir film (W oxidation preventing barrier metal film) 125 and the W oxidation preventing insulating film 129. Also, concerning the contact between wirings provided in regions higher than the ferroelectric capacitors such as the bit lines and the substrate (the diffusion layer), the formation of the contact holes and the embedding of the glue films and W plugs are performed by two series of the steps. That is, the via-to-via structure is formed. Therefore, the aspect ratio of contact holes decreases and the formation of the contact holes is relatively easy even scaling down is promoted.

However, in the manufacturing method shown in FIGS. 54A and 54B, in a place where the spacing between adjacent Ir films 125 is narrow, the surface of the W oxidation preventing insulating film 129 becomes steep and a deep trench is formed. Therefore, during the formation of the capacitor adhesive insulating film 150 this deep trench is not embedded with the capacitor adhesive insulating film 150 and a clearance 151 remains.

Figure 55A:
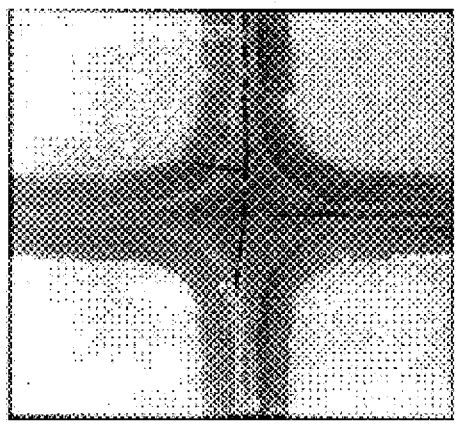
FIGS. 55A and 55B are each a scanning electron micrograph that shows slits and cracks.
Figure 55B:

And if the polishing of the capacitor adhesive insulating film 150, the W oxidation preventing insulating film 129 and the Ir film 125 is performed, with the clearance 151 kept, then slits and cracks occur, with the clearance 151 serving as an initiation point as shown in FIGS. 55A and 55B.

Furthermore, during the etching of the top electrode 132 and so on and during the removal of a hard mask used in the etching, with the slits and cracks kept, also the W oxidation preventing insulating film 129 is etched via the slits and cracks and even the interlayer dielectric film 122 might be etched.

Furthermore, if in this state the high-temperature annealing during capacitor formation (crystallization annealing or recovery annealing) is performed, then oxygen reaches even the W plug 124 via the interlayer dielectric film 122 and so on through the slits and cracks and the W plug is oxidized.

Therefore, in the reference example, it is difficult to obtain a high yield with suppressing an increase in contact resistance. Incidentally, even when the method disclosed in the Japanese Patent Application Laid-Open No. 4-323821 or the Japanese Patent Application Laid-Open No. 11-133457, it is impossible to prevent the occurrence of slits and cracks in a ferroelectric memory as described above.

Hence, to prevent the occurrence of slits and cracks the present inventors have devoted themselves to examinations and eventually hit upon various forms as described below.

First Embodiment

Next, the first embodiment of the present invention will be described. FIGS. 2A and 2B to FIGS. 12A and 12B are sectional views that show, in order of step, a method of manufacturing a ferroelectric memory (semiconductor device) according to the first embodiment of the present invention. Similarly, FIGS. 13A and 13B to FIGS. 23A and 23B are each a sectional view that shows, in order of step, a method of manufacturing a ferroelectric memory according to the first embodiment of the present invention. FIGS. 2A and 2B to FIGS. 12A and 12B each show a section perpendicular to the direction in which bit lines 3 extend, and FIGS. 13A and 13B to FIGS. 23A and 23B each show a section perpendicular to the direction in which word lines 4 extend. FIGS. 13A and 13B each show a part corresponding to two MOS transistors that share one bit line (corresponding to a bit line 3 in FIG. 1). FIGS. 2A to 23A each show the section of a memory cell array part of the ferroelectric memory, and FIGS. 2B to 23B each show the section of a logic part (a logic circuit part) including a driver, a reading-out circuit and the like provided at the periphery of the memory cell array.

In the first embodiment, as shown in FIGS. 2A and 2B and FIG. 13A and 13B, a well 12 is first formed on the surface of a semiconductor substrate 11 such as a silicon substrate. Subsequently, an element isolation region 13 is formed on the surface of the semiconductor substrate 11 with STI (shallow trench isolation), for example. Subsequently a gate insulating film 14, a gate electrode 15, a cap film 16, a side wall 17, a source-drain diffusion layer 18 and a silicide layer 19 are formed on the surface of the well, so that a MOS transistor (a switching element) 20 is formed. This MOS transistor 20 corresponds to a MOS transistor 2 in FIG. 1. Incidentally, for each MOS transistor 20, two source-drain diffusion layers 18 are formed for a source and a drain and one of the source-drain diffusion layers 18 is shared by two MOS transistors 20.

Next, a silicon oxynitride film 21 is formed on the whole surface in such a manner as to cover the MOS transistor 20, a silicon oxide film 22 is further formed on the whole surface as an interlayer dielectric film, and the silicon oxide film 22 is planarized by CMP (chemical mechanical polishing) or the like. The silicon oxynitride film 21 is formed to prevent the hydrogen degradation of the gate insulating film 14 and the like during the formation of the silicon oxide film 22. After that, a contact hole that reaches each silicide layer 19 is formed in the silicon oxide film 22 and the silicon oxynitride film 21, so that a plug contact part is opened. And after the formation of a glue film 23 in the contact hole, a W film is embedded by a CVD process, for example, and planarization is performed by CMP, whereby a W plug (a contact plug) 24 is formed. Subsequently, $N_2$ plasma treatment is performed at 350° C. for 120 seconds. As the glue film 23, for example, a stacked member composed of a Ti film having a thickness of 20 nm and a TiN film having a thickness of 50 nm is used.

Subsequently, as shown in FIGS. 3A and 3B and FIGS. 14A and 14B, an Ir film 25 having a thickness of, for example, 450 nm is formed on the whole surface as a W oxidation preventing barrier metal film. After that, a TiN film 26a and a plasma TEOS film 26b that are used as a hard mask during patterning the Ir film 25 are formed in this order. The thickness of the TiN film 26a and the plasma TEOS film 26b are, for example, 200 nm and 1200 nm, respectively. Subsequently, the plasma TEOS film 26b and the TiN film 26a are patterned, so that a hard mask 26 is formed only in a region where a stack type ferroelectric capacitor is to be formed.

Next, as shown in FIGS. 4A and 4B and FIGS. 15A and 15B, the etching of the Ir film 25 is performed with using the hard mask 26.

After that, as shown FIGS. 5A and 5B and FIGS. 16A and 16B, a plasma SiON film (a first insulating film) 27 is formed. The thickness of the plasma SiON film 27 is, for example, 150 nm. At this point of time, a relatively steep and deep trench is present on the plasma SiON film 27 particularly in a region to which the island-like Ir film 25 stands close.

Subsequently, Ar sputter etching is performed on the plasma SiON film 27. Concerning the conditions for Ar sputter etching, for example, for an RF power source, the source power is 1500 W (13.56 MHz) and the bias power is 1600 W (800 kHz). Also, the pressure in the chamber is 13.3 Pa (100 mTorr), the flow rate of Ar gas is 400 sccm, and the etching time is 30 seconds. As a result, after the removal of the part of the plasma SiON film 27 on the hard mask 26, etching is completed before the part of the plasma SiON film 27 on the silicon oxide film 22 is completely removed. In this Ar sputter etching, generated residues accumulate on the part of the plasma SiON film 27 that remains at that time. And as shown in FIGS. 6A and 6B and FIGS. 17A and 17B, the surface of the plasma SiON film 27 becomes gentler gradually and the shape of the plasma SiON film 27 approaches a flat shape. Therefore, the steep and deep trench disappears from the plasma SiON film 27.

Next, as shown in FIGS. 7A and 7B and FIGS. 18A and 18B, a plasma SiON film (a second insulating film) 28 is formed. The thickness of the plasma SiON film 28 is, for example, 900 nm. Because at this time there is no steep and deep trench in the plasma SiON film 27, no void is generated between the plasma SiON film 28 and the plasma SiON film 27. A W oxidation preventing insulating film 29 that prevents the oxidation of the W plug 24 exposed in the logic part is composed of the plasma SiON films 27 and 28.

Subsequently, as shown in FIGS. 8A and 8B and FIGS. 19A and 19B, the W oxidation preventing insulating film 29 (the plasma SiON films 27 and 28), the hard mask 36 (the plasma TEOS film 26b and the TiN film 26a) and the Ir film 25 are polished by a CMP process. At this time, the remaining film thickness of the Ir film 25 and W oxidation preventing insulating film 29 after CMP is, for example, 350 nm.

In manufacturing a ferroelectric memory, it is necessary to perform, after that, etching of a film that constitutes a ferroelectric capacitor, and removal of a hard mask used in this etching, as will be described later. And as a result of the etching and removal, the thickness of the W oxidation preventing insulating film 29 will decrease by about 250 nm. Also, after the removal of the hard mask, to recover damage during etching, for example, furnace heat treatment is to be performed in an oxygen atmosphere at 650° C. for 60 minutes. At this time, it is necessary that in order to prevent the oxidation of the W plug 24, the W oxidation preventing insulating film 29 have a thickness of not less than 100 nm. Therefore, in this embodiment, to ensure that a thickness of about 100 nm remains even when the thickness of the W oxidation preventing insulating film 29 decreases by about 250 nm, the remaining film thickness of the W oxidation preventing insulating film 29 should be, for example, 350 nm.

After that, as shown in FIGS. 9A and 9B and FIGS. 20A and 20B, a bottom electrode film 30, a ferroelectric film 31 and a top electrode film 32 are formed in this order on the whole surface. For example, a stacked member composed of a 200 nm thick Ir film, a 23 nm thick PtO film and a 50 nm thick Pt film, which are formed in this order, is used as the bottom electrode film 30. A Pb(Zr,Ti)O$_3$ film (PZT film) having a thickness of, for example, 200 nm is used as the ferroelectric film 31. An IrO$_2$ film having a thickness of, for example, 200 nm is used as the top electrode film 32.

Incidentally, before and after the formation of the bottom electrode film 30, annealing for preventing film exfoliation is performed. For example, RTA (rapid thermal annealing) is performed in an Ar atmosphere at 750° C. for 60 seconds as the annealing. Also, after the formation of the ferroelectric film 31, crystallization annealing is performed. For example, RTA at 600° C. for 90 seconds using Ar and O$_2$, and RTA in an oxygen atmosphere at 750° C. for 60 seconds are performed as the annealing.

After the formation of the top electrode film 32, a TiN film 33a and a plasma TEOS film 33b which are used as a hard mask during patterning the bottom electrode film 30, the ferroelectric film 31 and the top electrode film 32 are formed in this order. Subsequently, the plasma TEOS film 33b and the TiN film 33a are patterned, so that a hard mask 33 is formed only in a region where a stack type ferroelectric capacitor is to be formed.

Subsequently, as shown in FIGS. 10A and 10B and FIGS. 21A and 21B, a stack type ferroelectric capacitor is formed by spontaneously processing the top electrode film 32, the ferroelectric film 31 and the bottom electrode film 30 with patterning and etching techniques using the hard mask 33 as a mask. This ferroelectric capacitor corresponds to the ferroelectric capacitor 1 shown in FIG. 1.

Next, as shown in FIGS. 11A and 11B and FIGS. 22A and 22B, the hard mask 33 is removed. As a result of the processing from the etching of the top electrode film 32, the ferroelectric film 31 and the bottom electrode film 30 to the removal of the hard mask 33, the thickness of the W oxidation preventing insulating film 29 decreases by about 250 nm and the W oxidation preventing insulating film 29 remains about 100 nm. Subsequently, to recover damage to the ferroelectric film 31 by film forming and etching processes and the like, recovery annealing is performed. At the recovery annealing, furnace annealing is performed, for example, in an oxygen atmosphere at 650° C. for 60 minutes.

After that, as shown in FIGS. 12A and 12B and FIGS. 23A and 23B, an alumina film 34 is formed on the whole surface as a protective film that protects the ferroelectric capacitor from process damage. The thickness of the alumina film 34 is, for example, 50 nm. Next, furnace annealing is performed, for example, in an oxygen atmosphere at 650° C. for 60 minutes. Subsequently, an interlayer dielectric film 35 is formed on the whole surface and the planarization of the interlayer dielectric film 35 is performed by CMP. The remaining film thickness of the interlayer dielectric film 35 after the CMP is, for example, 400 nm on the top electrode film 32.

Subsequently, by patterning and etching techniques, a contact hole that reaches the W plug 24 is formed in the interlayer dielectric film 35, alumina film 34 and W oxidation preventing insulating film 29. Next, annealing is performed, for example, in an oxygen atmosphere at 550° C. for 60 minutes. Subsequently, after forming a glue film 36 in the contact hole, a W film is embedded and planarization is performed by CMP, whereby a W plug 37 is formed. As the glue film 36, TiN having a thickness of, for example, 50 nm can be used. After that, the surfaces of the interlayer dielectric film 35 and W plug 37 are exposed to $N_2$ plasma, for example, at 350° C. The time of this plasma treatment is, for example, 120 seconds.

Subsequently, a W oxidation preventing insulating film (not shown) is formed on the whole surface. For example, an SiON film is used as the W oxidation preventing insulating film and the thickness thereof is, for example, about 100 nm. Then, with patterning and etching techniques a contact hole that reaches the top electrode film 32 is formed in the W oxidation preventing insulating film and the interlayer dielectric film 35. Subsequently, annealing to recover damage by etching is performed. This annealing is performed, for example, in an oxygen atmosphere at 550° C. for 60 minutes. After this annealing, the W oxidation preventing insulating film is removed by etch back.

Next, a lower-layer glue film 38, a wiring material film 39 and an upper-layer glue film 40 are deposited in this order. As the lower-layer glue film, a TiN film having a thickness of, for example, 100 nm is used. As the wiring material film, an Al—Cu alloy film having a thickness of, for example, 400 nm is used. As the upper-layer glue film, for example, a stacked member composed of a Ti film having a thickness of 5 nm and a TiN film having a thickness of 70 nm is used.

Subsequently, an antireflection film (not shown) is formed on the glue film 40 and a resist film (not shown) is applied. Subsequently, the resist film is processed in such a manner as to be aligned with a wiring pattern, and the antireflection film, the glue film 40, the wiring material film 39 and the glue film 38 are etched with using the resist film after processing as a mask. As the antireflection film, for example, an SiON film is used and the thickness thereof is, for example, about 31 nm. As a result of the etching, as shown in FIGS. 12A and 12B and FIGS. 23A and 23B, a wiring 41 of a prescribed plane shape that is composed of the glue film 40, the wiring material film 39 and the glue film 38 is obtained.

After that, the formation of an interlayer dielectric film, the formation of a contact plug, the formation of wirings for the second and later layers, and the like are further carried out. And a cover film that is composed, for example, of a TEOS film and an SiN film is formed, so that a ferroelectric memory having a ferroelectric capacitor is completed. Incidentally, in the formation of upper-layer wirings, the wiring 41 connected to the top electrode film 32 is connected to the plate line and the wiring 41 connected to the source-drain diffusion layer 18 shared by the two MOS transistors 20 is connected to the bit line. For the gate electrode 15, the gate electrode 15 may be the word line itself or in the upper-layer wirings, the gate electrode 15 may be connected to the word line.

As described above, in the first embodiment, in forming the W oxidation preventing insulating film 29 having a thickness of about 350 nm, the plasma SiON film 27 of about 150 nm is first formed and a steep trench is caused to disappear from the plasma SiON film 27 by performing Ar sputter etching, and then, the plasma SiON film 28 of about 900 nm is formed. Therefore, according to the first embodiment, the generation of voids in the W oxidation preventing insulating film 29 is prevented. As a result, it becomes possible to suppress a rise in contact resistance even when the annealing temperature is raised while preventing the occurrence of cracks and slits.

Figure 12A:
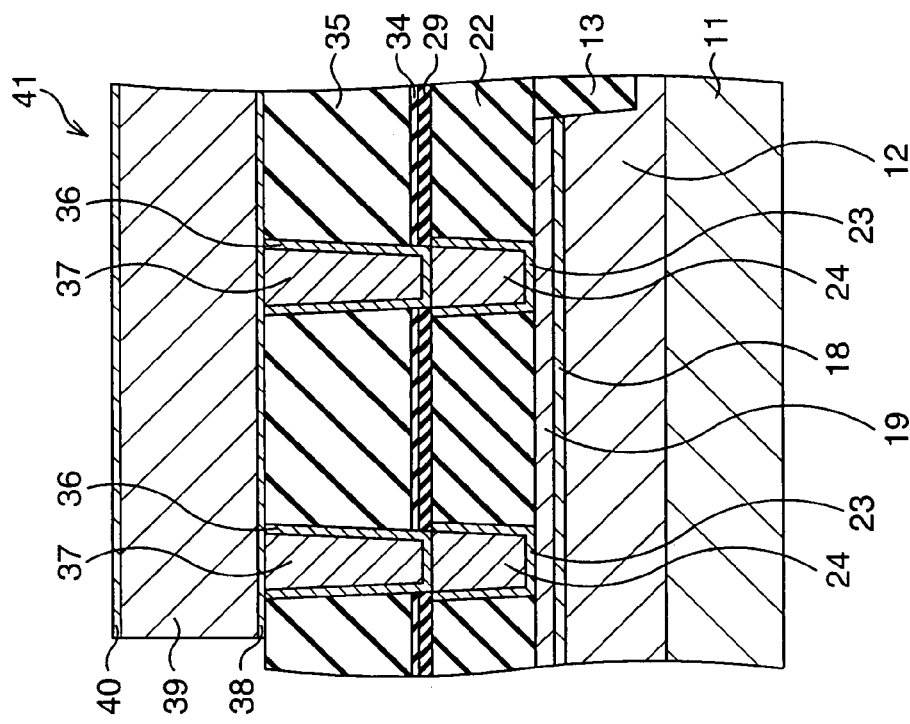
FIGS. 12A and 12B are each a sectional view that shows a method of manufacturing a ferroelectric random access memory in a step after the step shown in FIGS. 11A and 11B in the first embodiment of the present invention.
Figure 12B:
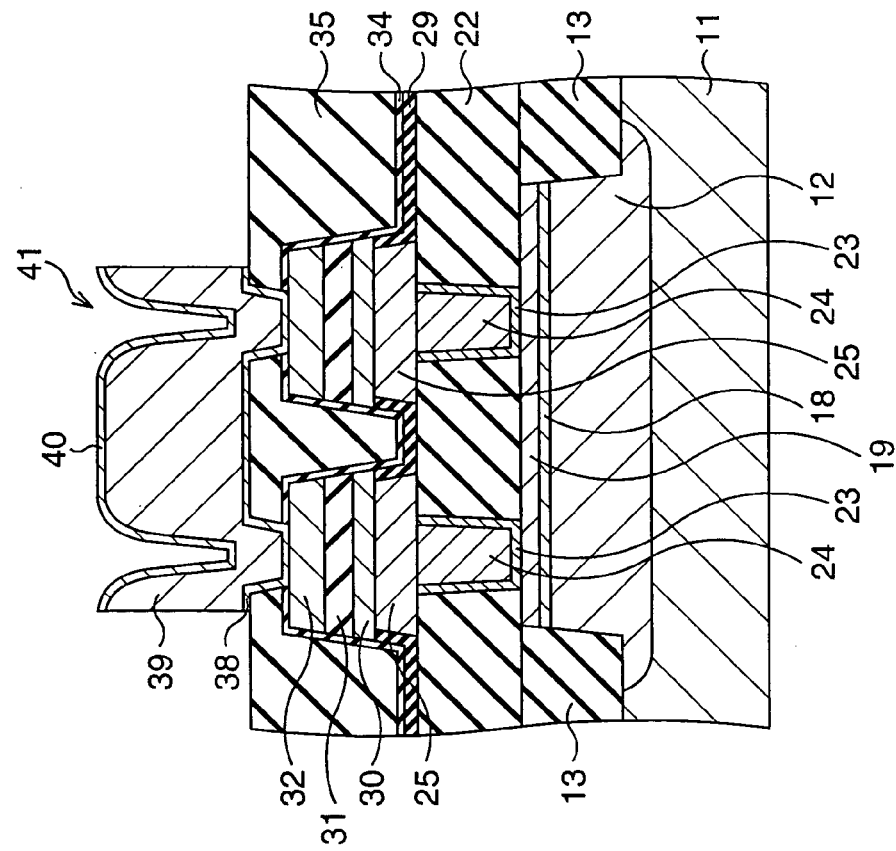
Figure 13A:
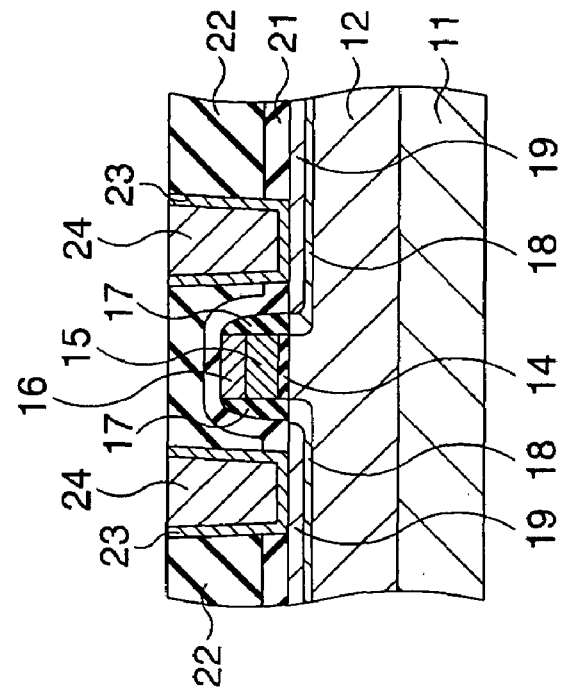
FIGS. 13A and 13B are each a sectional view that shows, in order of step, a method of manufacturing a ferroelectric memory according to the first embodiment of the present invention.
Figure 13B:
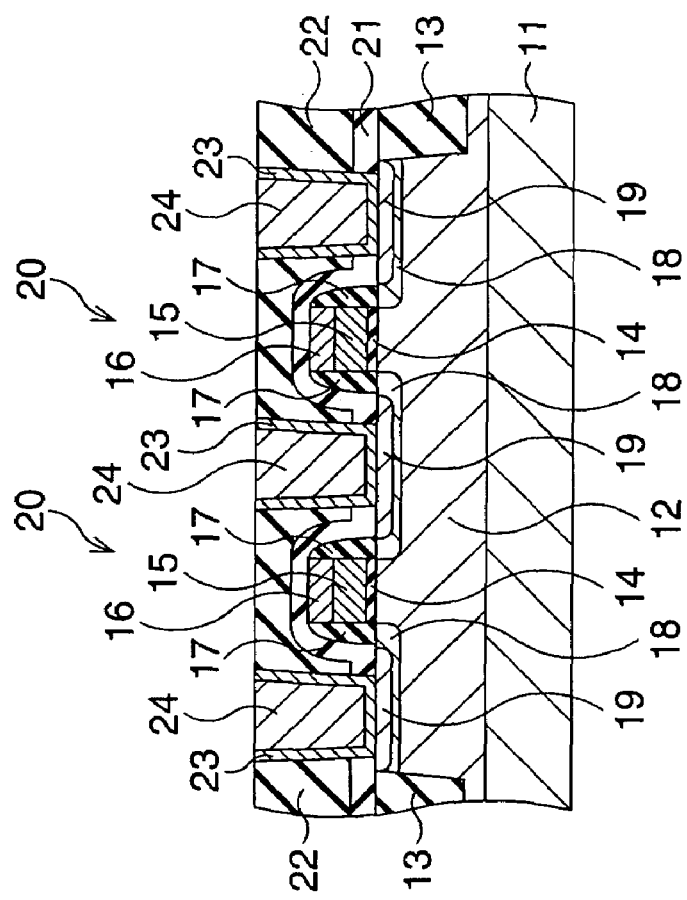
Figure 14A:
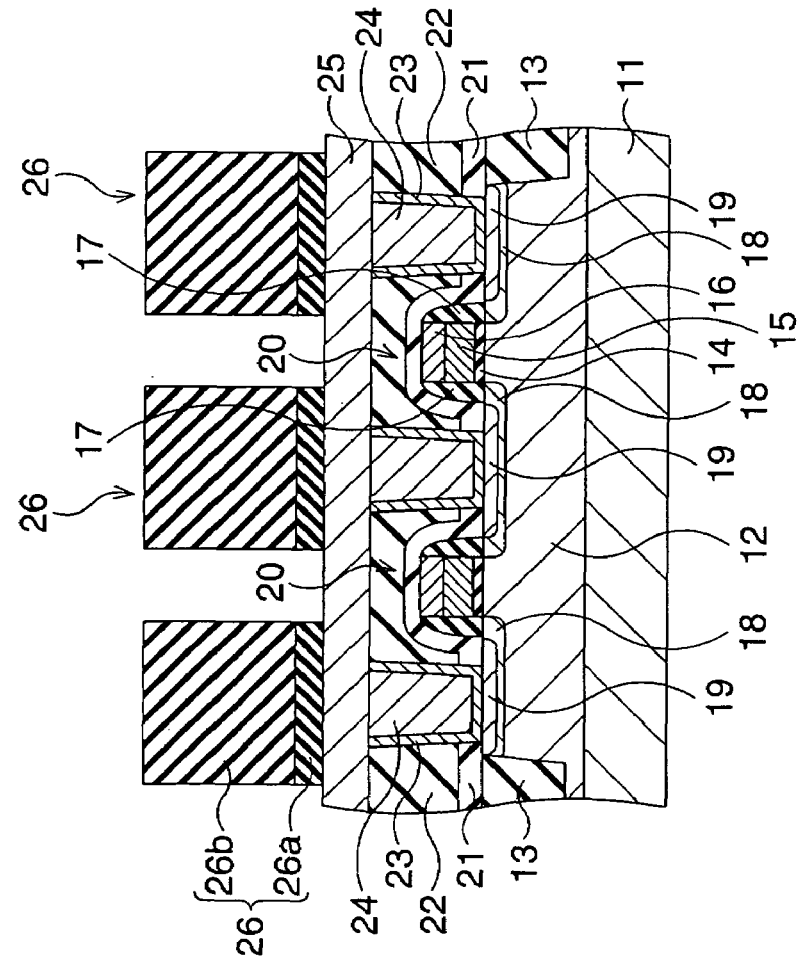
FIGS. 14A and 14B are each a sectional view that shows a method of manufacturing a ferroelectric memory in a step after the step shown in FIGS. 13A and 13B according to the first embodiment of the present invention.
Figure 14B:
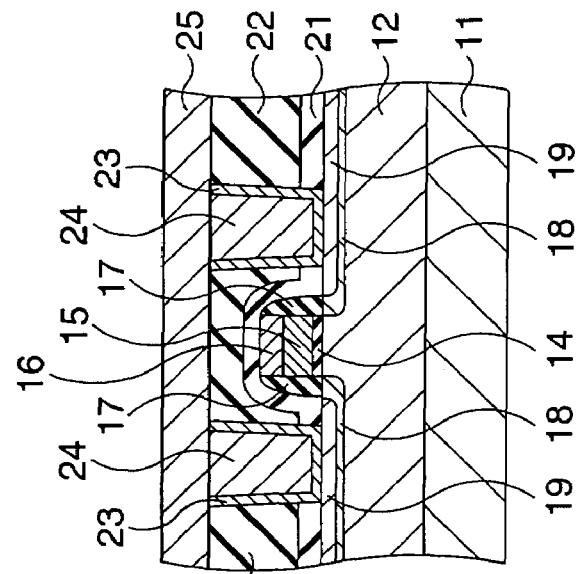
Figure 15B:
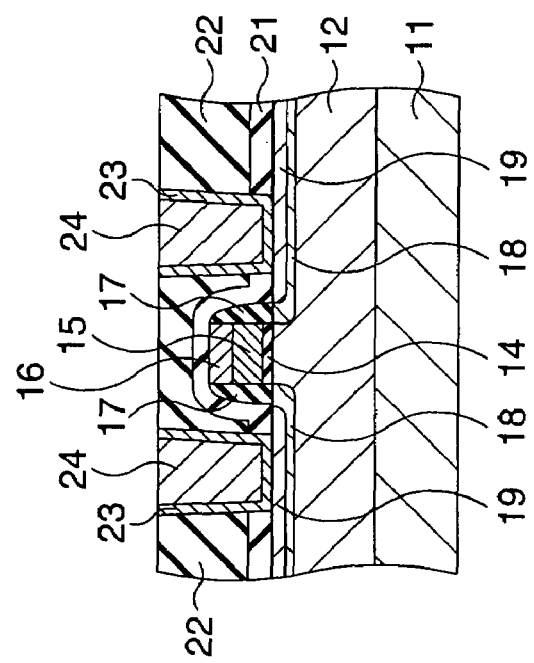
FIGS. 15A and 15B are each a sectional view that shows a method of manufacturing a ferroelectric memory in a step after the step shown in FIGS. 14A and 14B according to the first embodiment of the present invention.
Figure 15A:
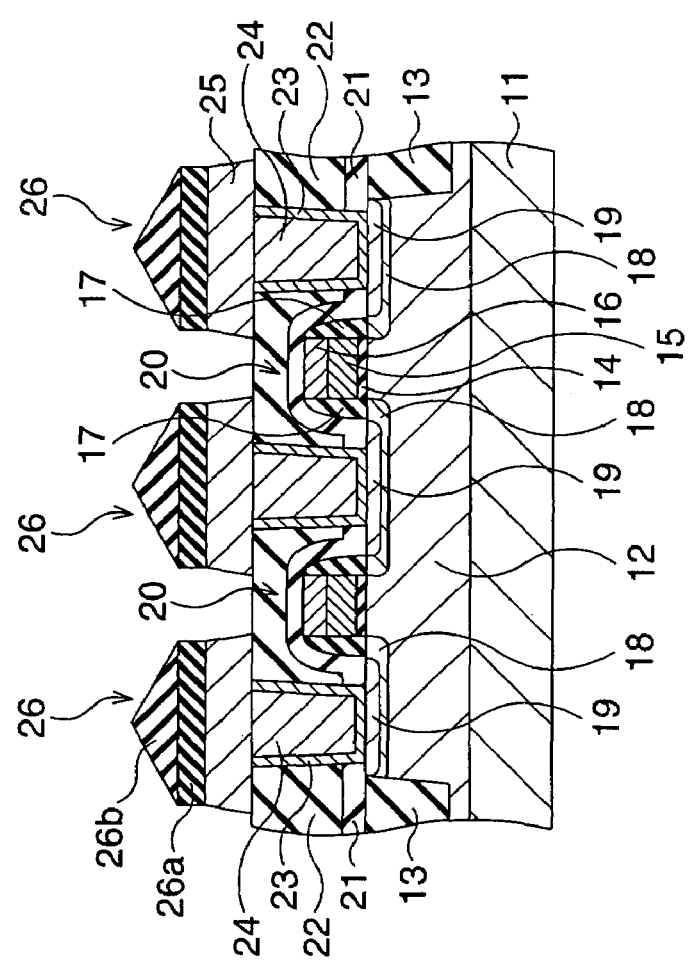
Figures 16A, 16B:
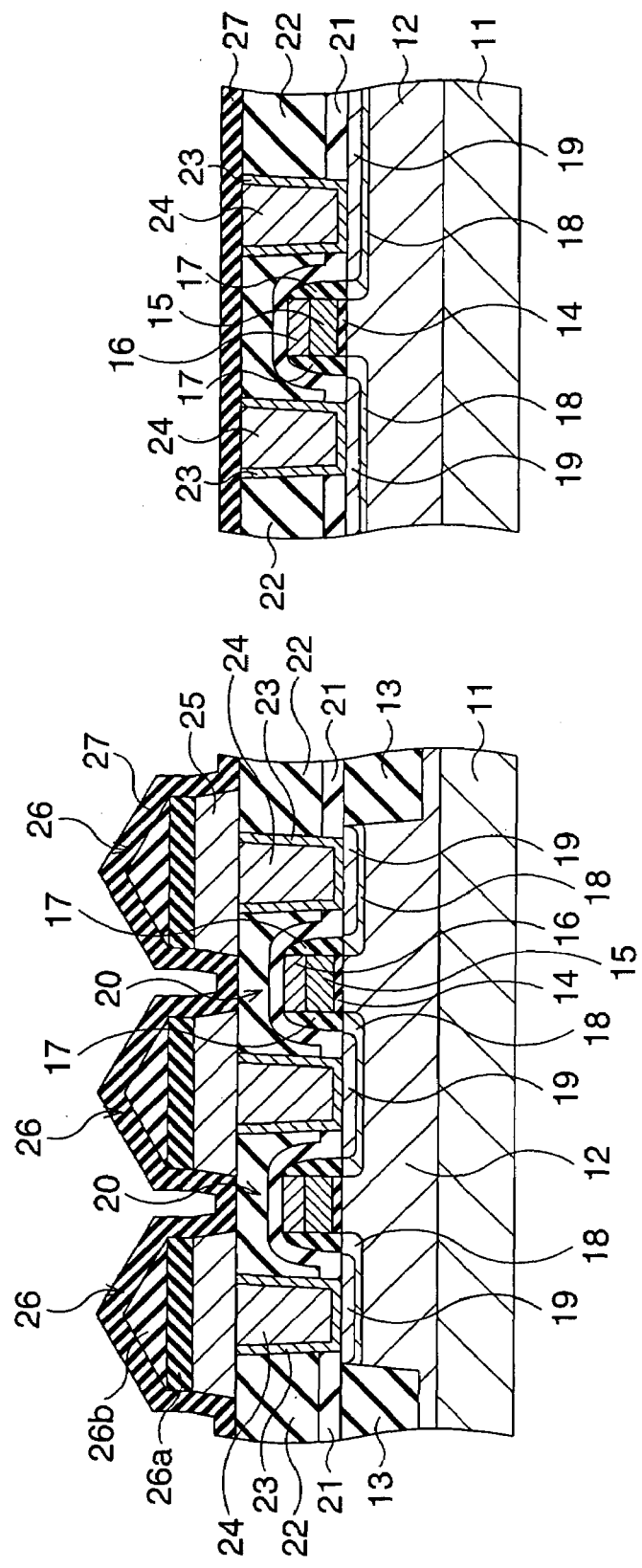
FIGS. 16A and 16B are each a sectional view that shows a method of manufacturing a ferroelectric memory in a step after the step shown in FIGS. 15A and 15B according to the first embodiment of the present invention.
Figures 18A, 18B:
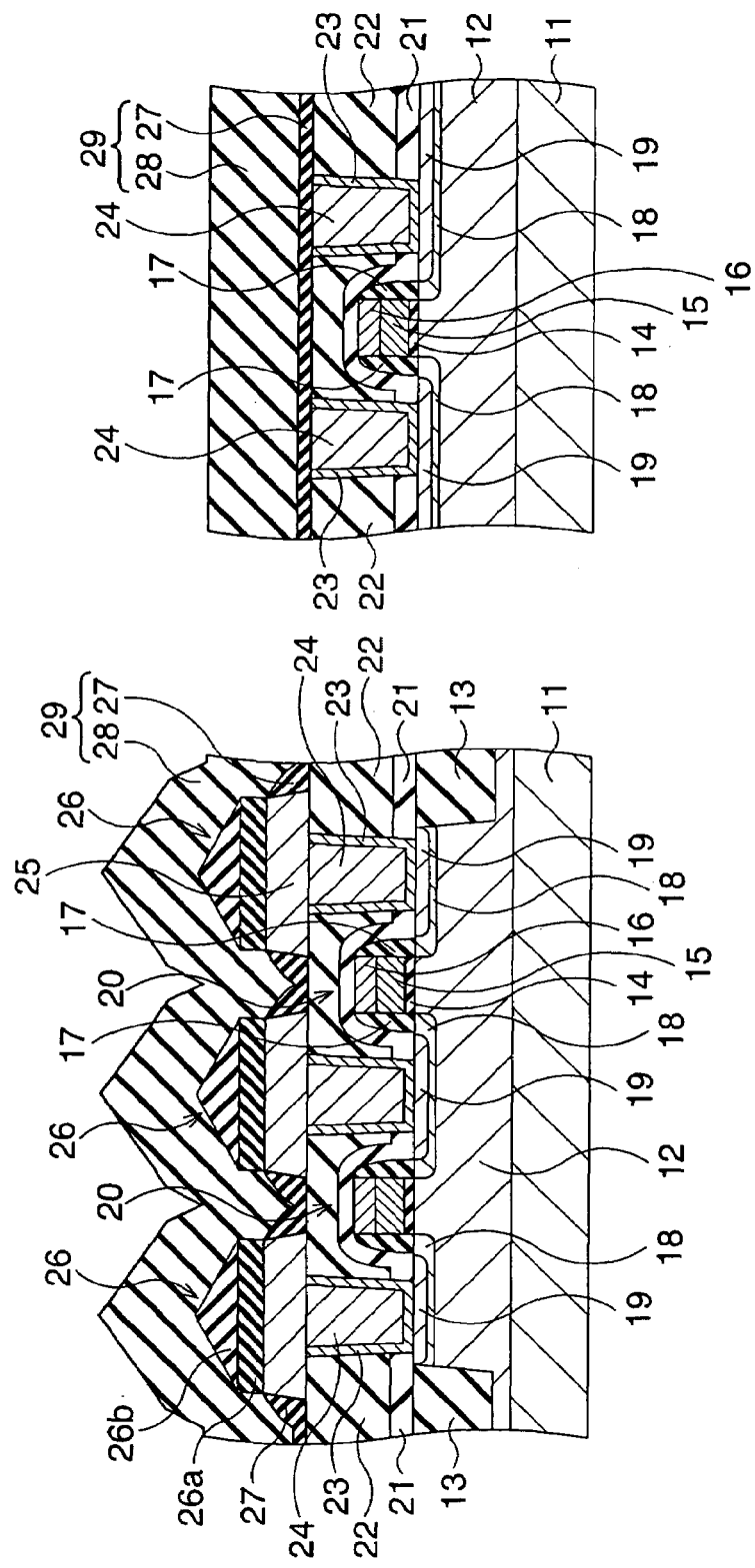
FIGS. 18A and 18B are each a sectional view that shows a method of manufacturing a ferroelectric memory in a step after the step shown in FIGS. 17A and 17B according to the first embodiment of the present invention.
Figure 21A:
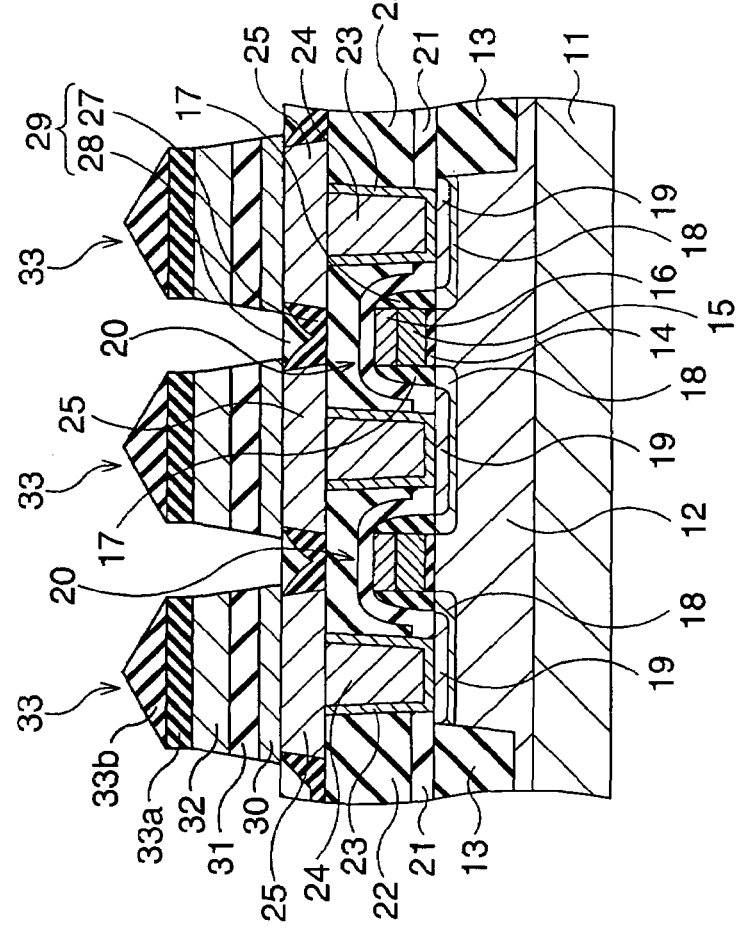
FIGS. 21A and 21B are each a sectional view that shows a method of manufacturing a ferroelectric memory in a step after the step shown in FIGS. 20A and 20B according to the first embodiment of the present invention.
Figure 21B:
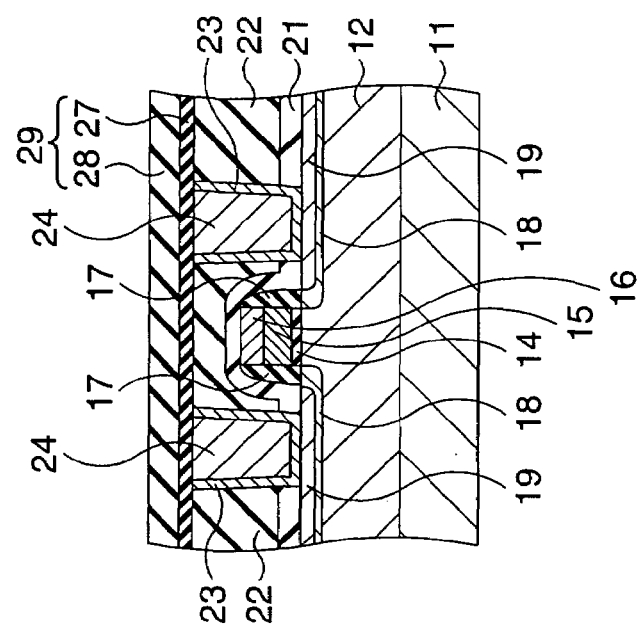
Figures 22A, 22B:
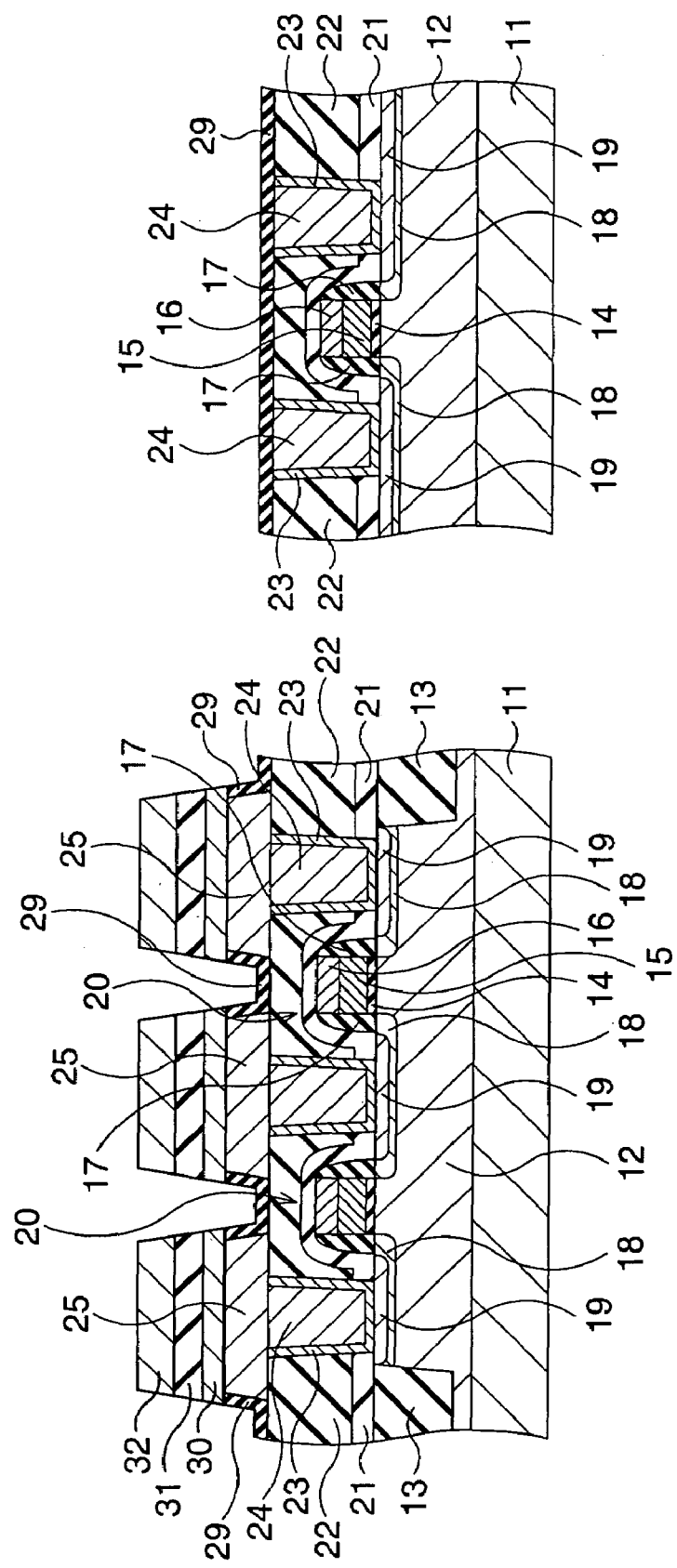
FIGS. 22A and 22B are each a sectional view that shows a method of manufacturing a ferroelectric memory in a step after the step shown in FIGS. 21A and 21B according to the first embodiment of the present invention.

Furthermore, according to this embodiment, in the logic part, as shown in FIGS. 12B and 23B, a via-to-via contact is realized from the W plugs 37 and 24. And the wiring 41 is connected to the source-drain diffusion layer 18 via this via-to-via contact. Because a large level difference corresponding to a ferroelectric capacitor is present in a ferroelectric memory compared to a usual logic article, the aspect ratio of the contact from the lowest-layer wiring 41 to the substrate (or a diffusion layer formed thereon) is relatively large. If in order to form the contact, a contact hole is opened by etching at once as in the conventional way, etching itself is difficult. Also, formation of a glue film is difficult. Therefore, new equipment suitable for opening such a contact hole and forming a glue film is necessary. In contrast, because etching and the formation of a glue film are relatively easy when a via-to-via hole is formed, it is possible to improve the yield of a ferroelectric memory and conventional equipments can be used as it is. Therefore, it is possible to reduce development expenses and process costs.

Second Embodiment

Next, a second embodiment of the present invention will be described. FIGS. 24A and 24B to FIGS. 32A and 32B are sectional views that show, in order of step, a method of manufacturing a ferroelectric memory (semiconductor device) according to the second embodiment of the present invention. These figures each show a section perpendicular to the direction in which bit lines 3 extend. FIGS. 24A to 32A each show the section of a memory cell array of the ferroelectric memory, and FIGS. 24B to 32B each show the section of a logic part.

Figure 24A:
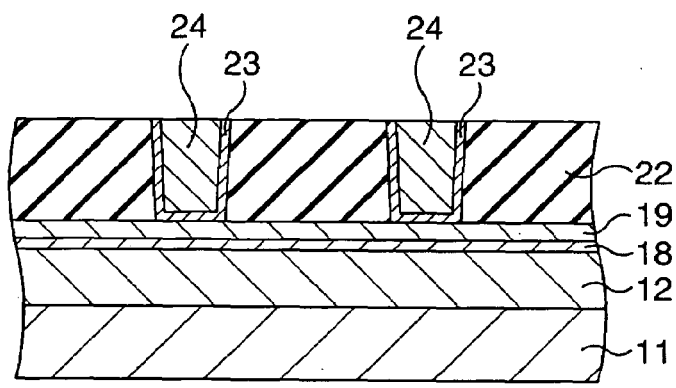
FIGS. 24A and 24B are each a sectional view that shows a method of manufacturing a ferroelectric memory according to a second embodiment of the present invention.
Figure 24B:
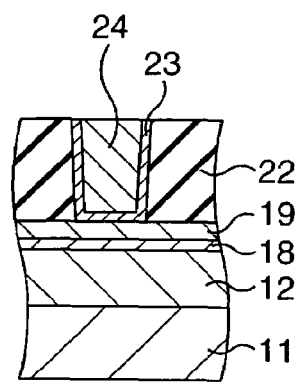

In the second embodiment, as shown in FIGS. 24A and 24B, series of processing from the formation of the well 12 to the formation of the W plug 24 are first performed in the same manner as with the first embodiment.

Figure 25A:
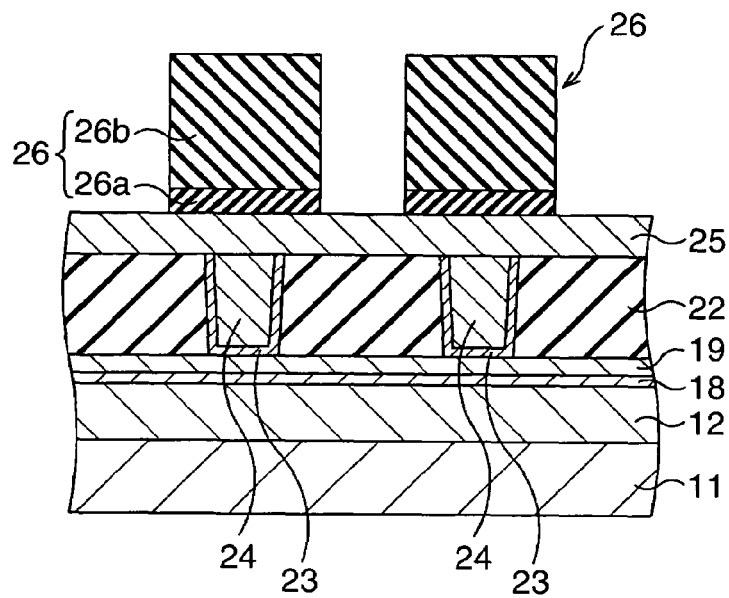
FIGS. 25A and 25B are each a sectional view that shows a method of manufacturing a ferroelectric memory in a step after the step shown in FIGS. 24A and 24B according to the second embodiment of the present invention.
Figure 25B:
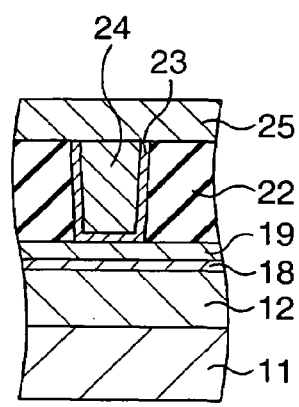

Next, as shown in FIGS. 25A and 25B, series of processing from the formation of the Ir film 25 to the formation of the hard mask 26 are performed in the same manner as with the first embodiment.

Figure 26A:
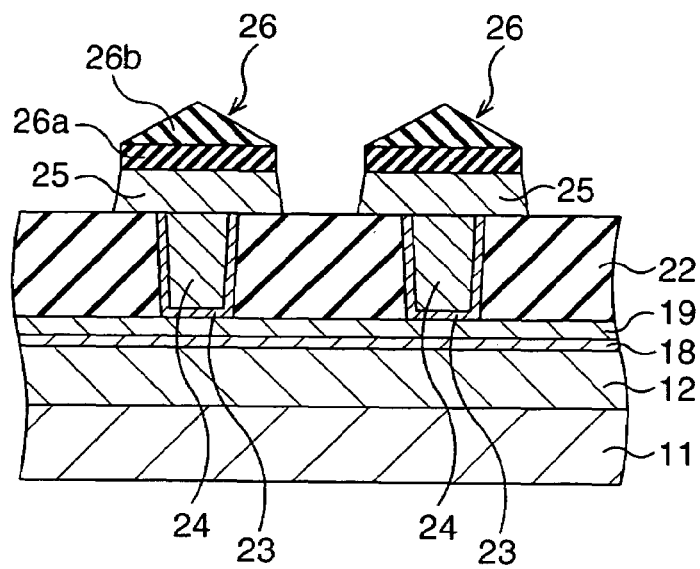
FIGS. 26A and 26B are each a sectional view that shows a method of manufacturing a ferroelectric memory in a step after the step shown in FIGS. 25A and 25B according to the second embodiment of the present invention.
Figure 26B:
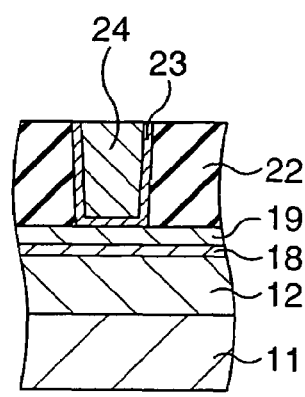

Subsequently, as shown in FIGS. 26A and 26B, the etching of the Ir film 25 is performed with using the hard mask 26 in the same manner as with the first embodiment.

Figure 27A:
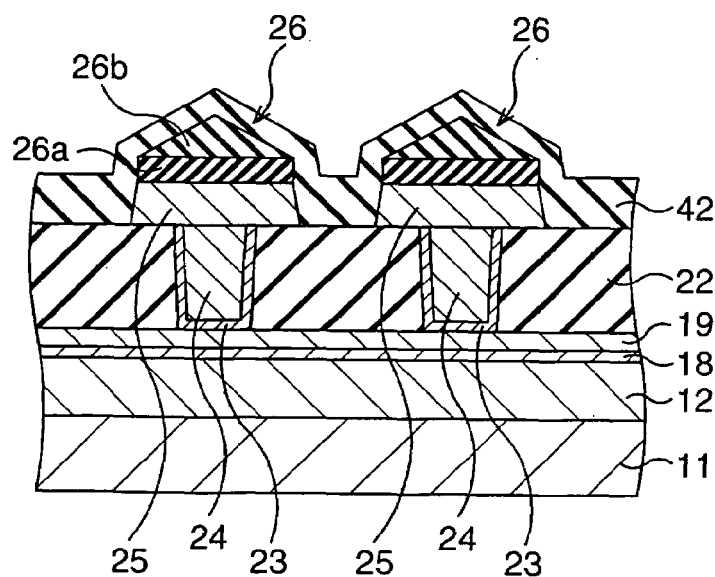
FIGS. 27A and 27B are each a sectional view that shows a method of manufacturing a ferroelectric memory in a step after the step shown in FIGS. 26A and 26B according to the second embodiment of the present invention.
Figure 27B:
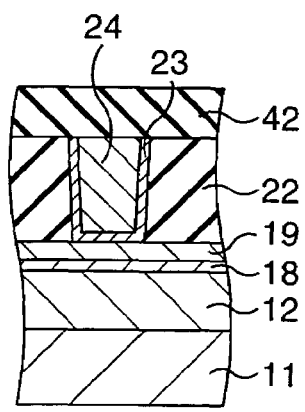

After that, as shown in FIGS. 27A and 27B, an SiON film 42 is formed as a W oxidation preventing insulating film on the whole surface by an HDP (high density plasma) process. The thickness of the SiON film 42 is, for example, 400 nm. Because a good coverage is obtained with the HDP process, it is possible to form the SiON film 43 without the occurrence of voids.

Figure 28A:
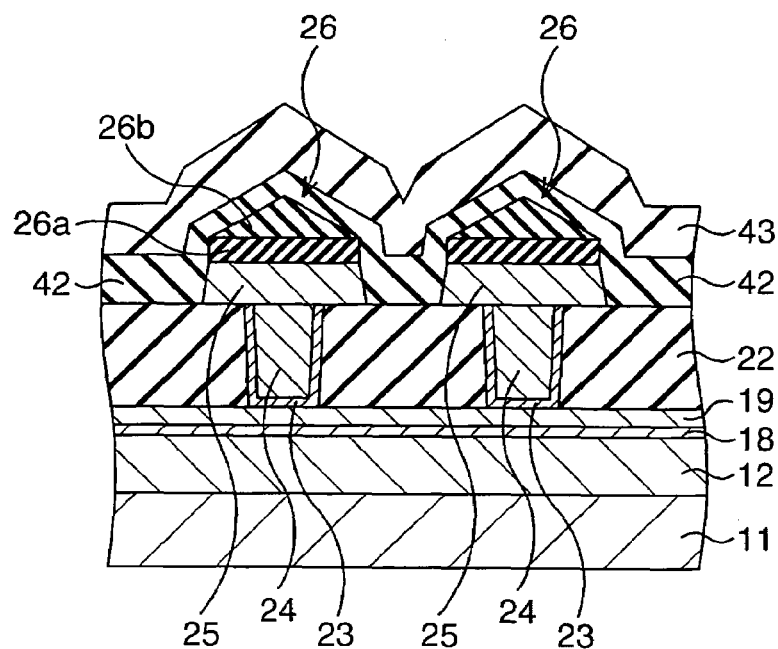
FIGS. 28A and 28B are each a sectional view that shows a method of manufacturing a ferroelectric memory in a step after the step shown in FIGS. 27A and 27B according to the second embodiment of the present invention.
Figure 28B:
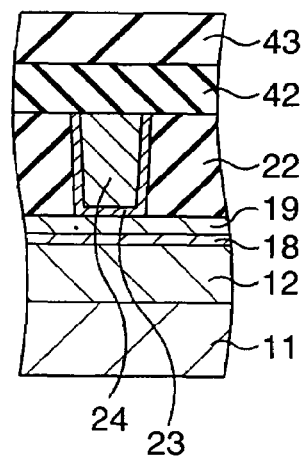

Subsequently, as shown in FIGS. 28A and 28B, a plasma TEOS film 43 is formed on the whole surface as a self-sacrificial film for CMP which is performed after that. The thickness of the plasma TEOS film 43 is, for example, 600 nm.

Figure 29A:
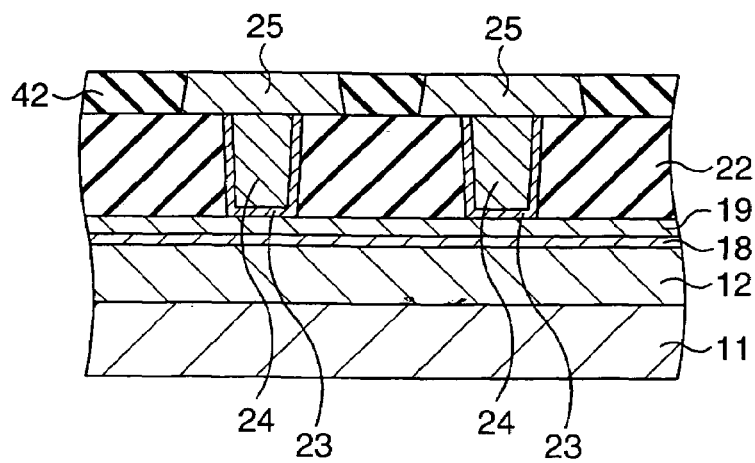
FIGS. 29A and 29B are each a sectional view that shows a method of manufacturing a ferroelectric memory in a step after the step shown in FIGS. 28A and 28B according to the second embodiment of the present invention.
Figure 29B:
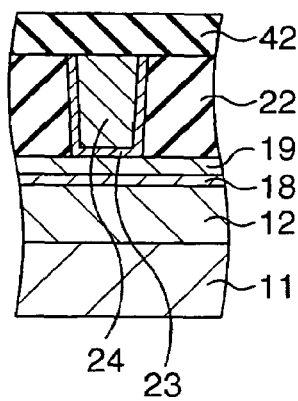

Next, as shown in FIGS. 29A and 29B, the plasma TEOS film (self-sacrificial film) 43, the SiON film (W oxidation preventing insulating film) 42, the hard mask 26 (the plasma TEOS film 26a and the TiN film 26a) and the Ir film 25 are polished by a CMP process. At this time, the remaining film thickness of the Ir film 25 and the SiON film (W oxidation preventing insulating film) 42 after the CMP is, for example, 350 nm.

Figure 30A:
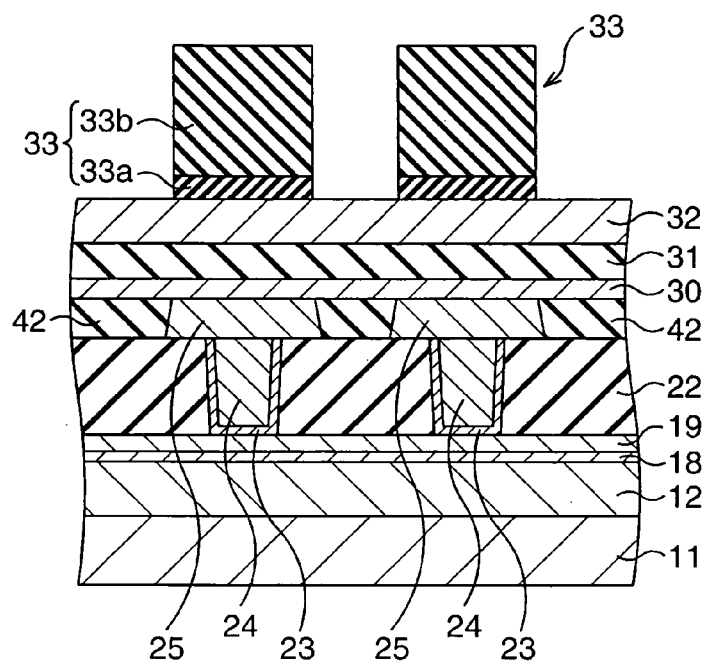
FIGS. 30A and 30B are each a sectional view that shows a method of manufacturing a ferroelectric memory in a step after the step shown in FIGS. 29A and 29B according to the second embodiment of the present invention.
Figure 30B:
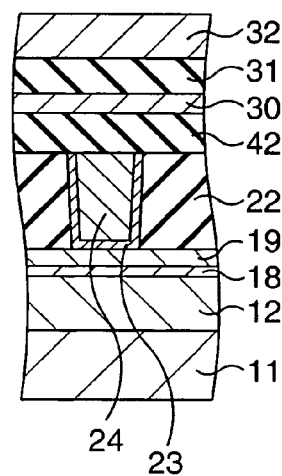

Subsequently, as shown in FIGS. 30A and 30B, series of processing from the formation of the bottom electrode film 30 to the formation of the hard mask 33 are performed in the same manner as with the first embodiment.

Figure 31A:
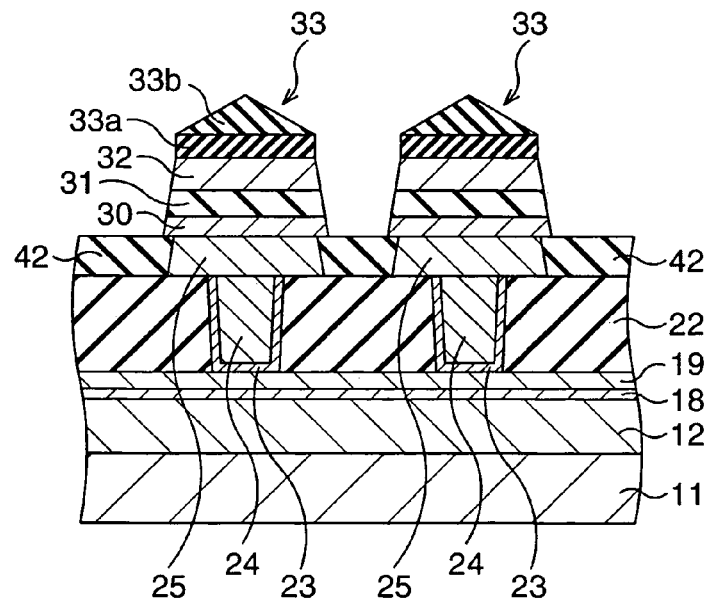
FIGS. 31A and 31B are each a sectional view that shows a method of manufacturing a ferroelectric memory in a step after the step shown in FIGS. 30A and 30B according to the second embodiment of the present invention.
Figure 31B:
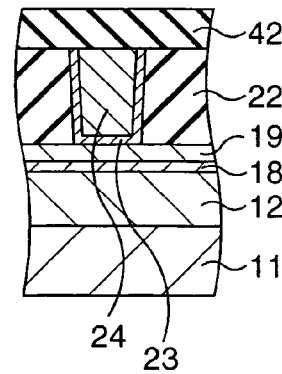

After that, as shown in FIGS. 31A and 31B, a ferroelectric capacitor of stack structure is formed by spontaneously processing the top electrode film 32, the ferroelectric film 31 and the bottom electrode film 30 in the same manner as with the first embodiment.

Subsequently, as shown in FIGS. 32A and 32B, series of processing from the removal of the hard mask 33 to the recovery annealing are performed in the same manner as with the first embodiment.

And a ferroelectric memory is completed with series of processing after the formation of the protective film in the same manner as with the first embodiment, although they are not shown in figures.

Because in the second embodiment the HDP process is used in forming the SiON film 42 as the W oxidation preventing insulating film, it is possible to from the SiON film 42 free from voids with a good coverage. Therefore, as with the first embodiment, it becomes possible to suppress a rise in contact resistance even when the annealing temperature is raised while preventing the occurrence of cracks and slits.

Third Embodiment

Figure 44A:
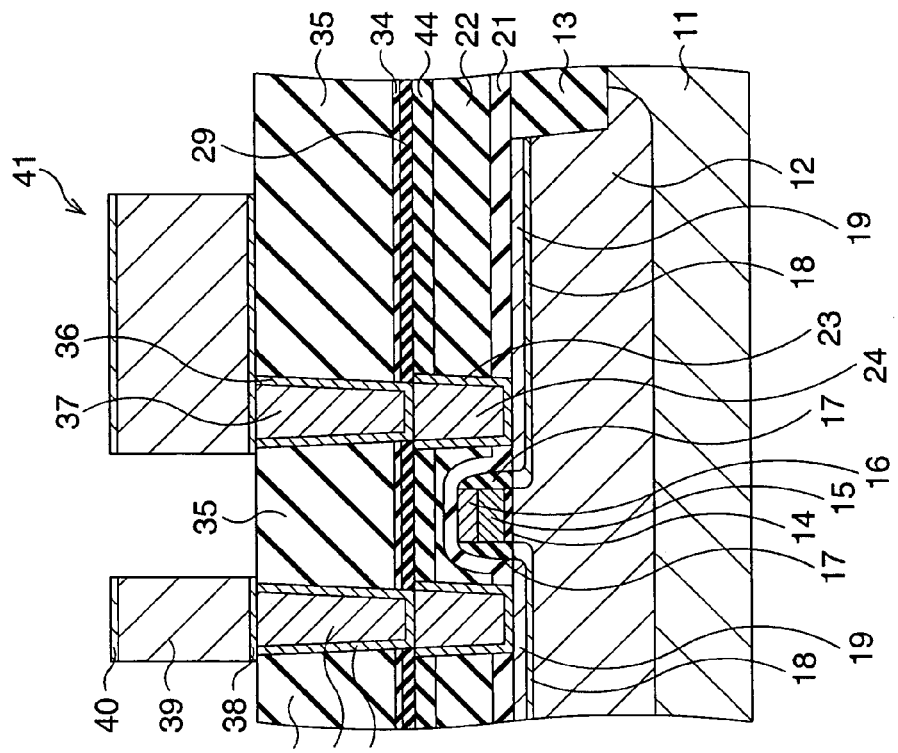
FIGS. 44A and 44B are each a sectional view that shows a section orthogonal to the section shown in FIGS. 43A and 43B, respectively.
Figure 44B:
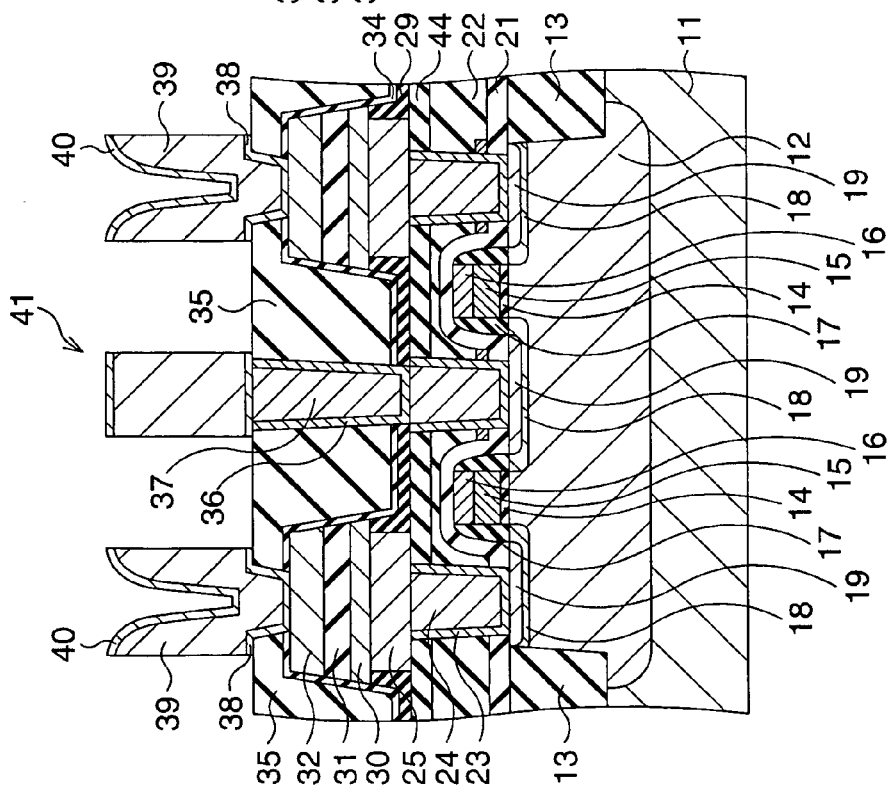

Next, a third embodiment of the present invention will be described. FIGS. 33A and 33B to FIGS. 43A and 43B are sectional views that show, in order of step, a method of manufacturing a ferroelectric memory (semiconductor device) according to the third embodiment of the present invention. These figures each show a section perpendicular to the direction in which bit lines 3 extend. FIGS. 33A and 43A each show the section of a memory cell array of the ferroelectric memory, and FIGS. 33B to 43B each show the section of a logic part. Furthermore, FIGS. 44A and 44B are each a sectional view that shows a section orthogonal to the section that shows FIGS. 43A and 43B, respectively, and shows a section perpendicular to the direction in which word lines 4 extend. FIG. 44A shows the section of a memory cell array part of the ferroelectric memory, and FIG. 44B shows the section of a logic part.

In the third embodiment, as shown in FIGS. 33A and 33B, series of processing from the formation of the well 12 to the planarization of the silicon oxide film 22 by the CMP process are first performed in the same manner as with the first embodiment. Next, an SiON film (a third insulating film) 44 is formed as a W oxidation preventing insulating film on the silicon oxide film 22. The thickness of the SiON film 44 is, for example, 300 nm. Subsequently, series of processing from the formation of the contact hole to the formation of the W plug 24 are performed in the same manner as with the first embodiment.

After that, as shown in FIGS. 34A and 34B, series of processing from the formation of the Ir film 25 to the formation of the hard mask 26 is performed in the same manner as with the first embodiment.

Subsequently, as shown in FIGS. 35A and 35B, of the Ir film 25 is etched with using the hard mask 26 in the same manner as with the first embodiment.

Figure 36A:
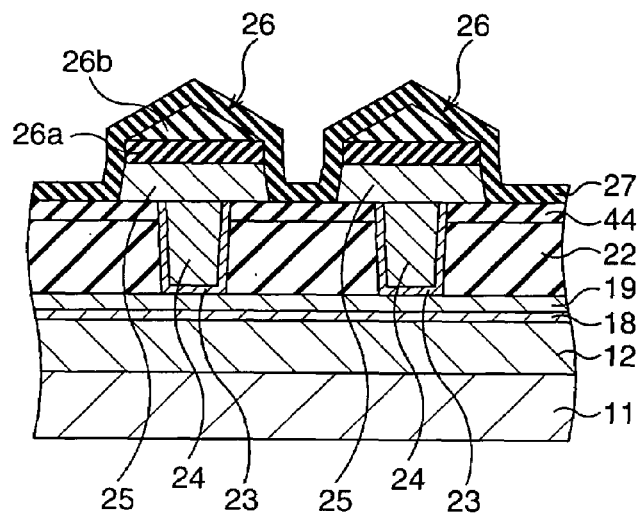
FIGS. 36A and 36B are each a sectional view that shows a method of manufacturing a ferroelectric memory in a step after the step shown in FIGS. 35A and 35B according to the third embodiment of the present invention.
Figure 36B:
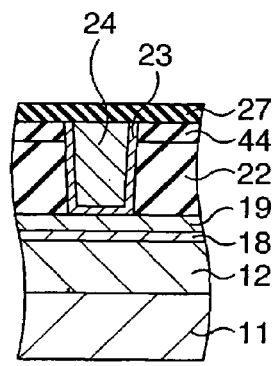

Next, as shown in FIGS. 36A and 36B, a plasma SiON film 27 is formed in the same manner as with the first embodiment.

Figure 37A:
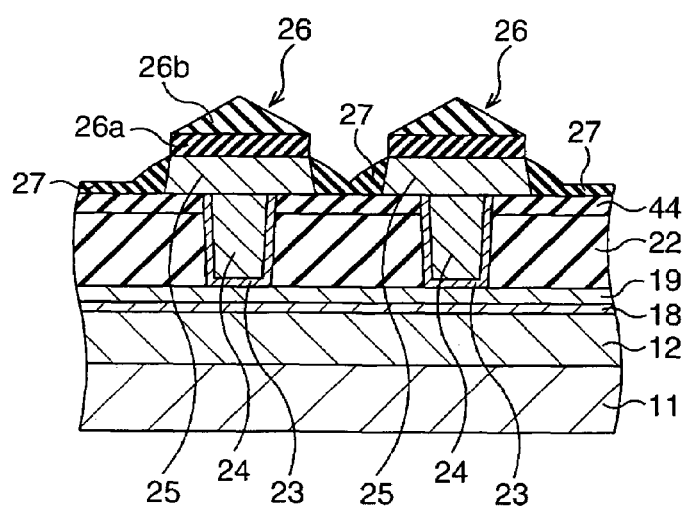
FIGS. 37A and 37B are each a sectional view that shows a method of manufacturing a ferroelectric memory in a step after the step shown in FIGS. 36A and 36B according to the third embodiment of the present invention.
Figure 37B:
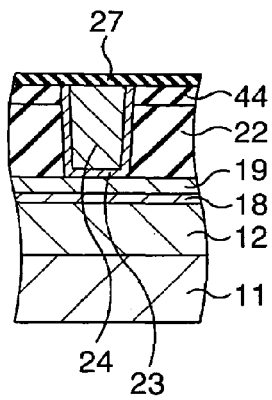

Subsequently, Ar sputter etching is performed on the plasma SiON film 27 in the same manner as with the first embodiment. As s result, as shown in FIGS. 37A and 37B, the deep trench disappears from the plasma SiON film 27.

Figure 38A:
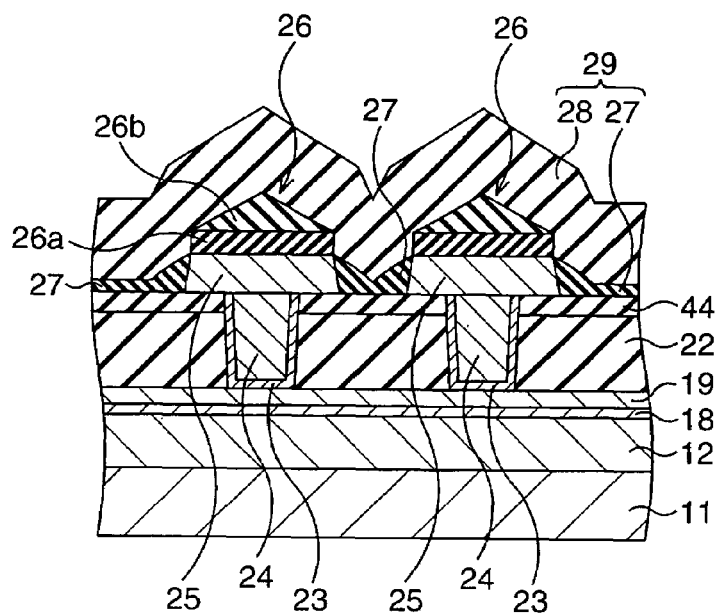
FIGS. 38A and 38B are each a sectional view that shows a method of manufacturing a ferroelectric memory in a step after the step shown in FIGS. 37A and 37B according to the third embodiment of the present invention.
Figure 38B:
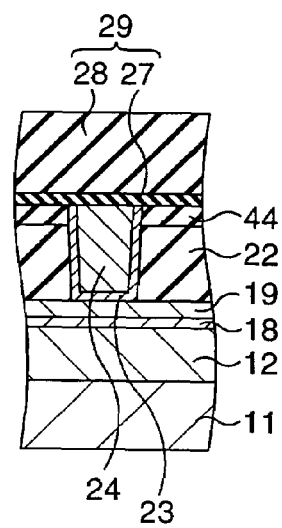

After that, as shown in FIGS. 38A and 38B, the plasma SiON film 28 is formed in the same manner as with the first embodiment.

Figure 39A:
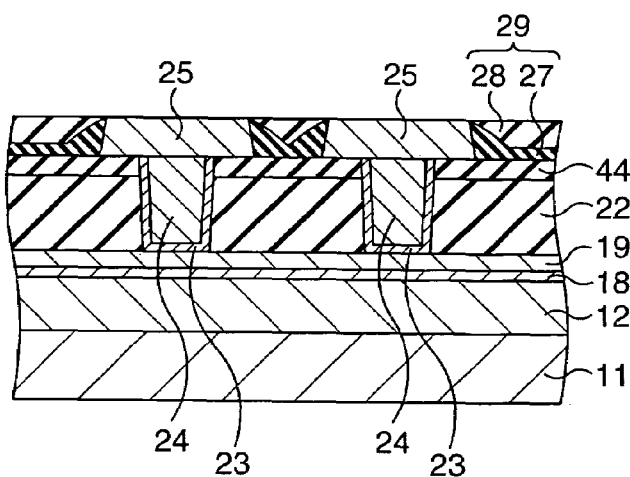
FIGS. 39A and 39B are each a sectional view that shows a method of manufacturing a ferroelectric memory in a step after the step shown in FIGS. 38A and 38B according to the third embodiment of the present invention.
Figure 39B:
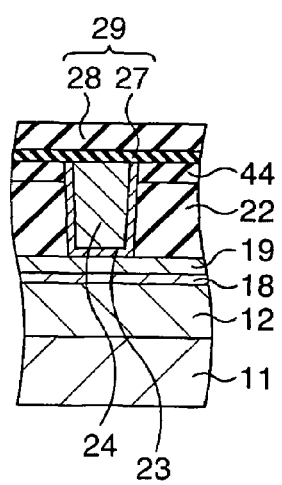

Subsequently, as shown in FIGS. 39A and 39B, the W oxidation preventing insulating film 29 (the plasma SiON films 27 and 28), the hard mask 26 (the plasma TEOS film 26b and the TiN film 26a) and the Ir film 25 are polished by a CMP process.

Figure 40A:
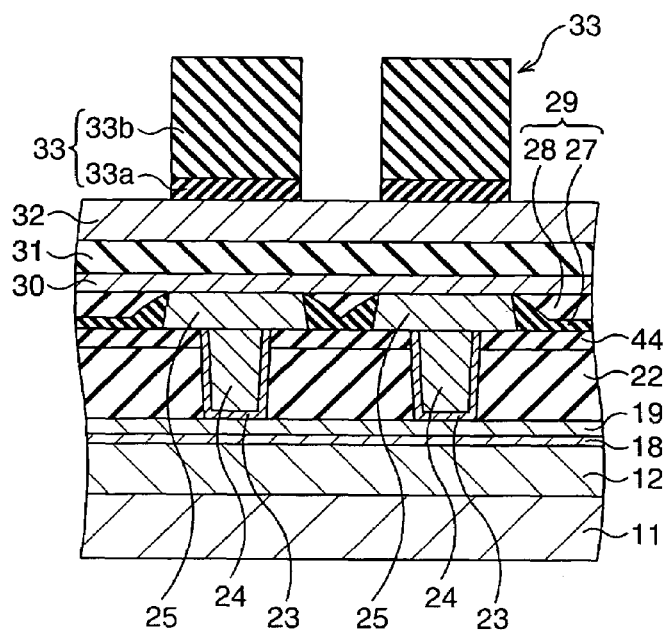
FIGS. 40A and 40B are each a sectional view that shows a method of manufacturing a ferroelectric memory in a step after the step shown in FIGS. 39A and 39B according to the third embodiment of the present invention.
Figure 40B:
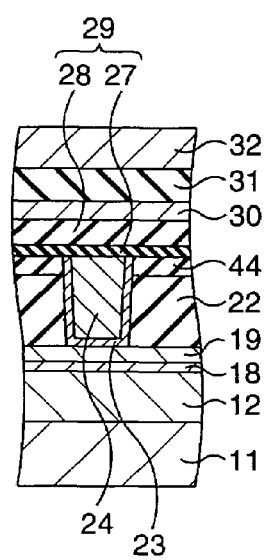

Next, as shown in FIGS. 40A and 40B, series of processing from the formation of the bottom electrode film 30 to the formation of the hard mask 33 are performed in the same manner as with the first embodiment.

Figure 41A:
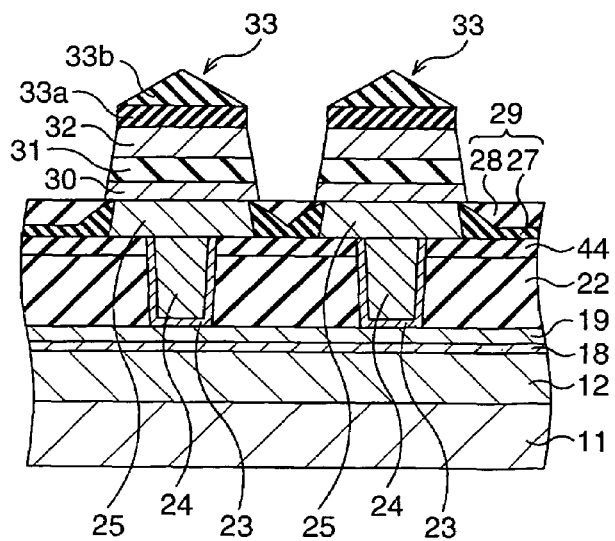
FIGS. 41A and 41B are each a sectional view that shows a method of manufacturing a ferroelectric memory in a step after the step shown in FIGS. 40A and 40B according to the third embodiment of the present invention.
Figure 41B:
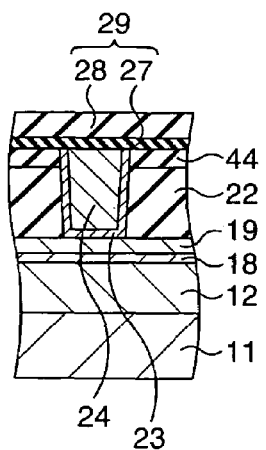

Subsequently, as shown in FIGS. 41A and 41B, a ferroelectric capacitor of stack structure is formed by spontaneously processing the top electrode film 32, the ferroelectric film 31 and the bottom electrode film 30 in the same manner as with the first embodiment.

Figure 42A:
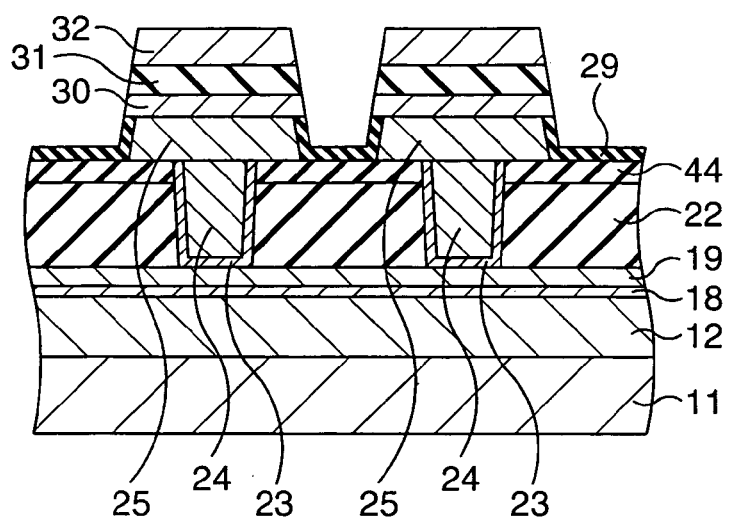
FIGS. 42A and 42B are each a sectional view that shows a method of manufacturing a ferroelectric memory in a step after the step shown in FIGS. 41A and 41B according to the third embodiment of the present invention.
Figure 42B:
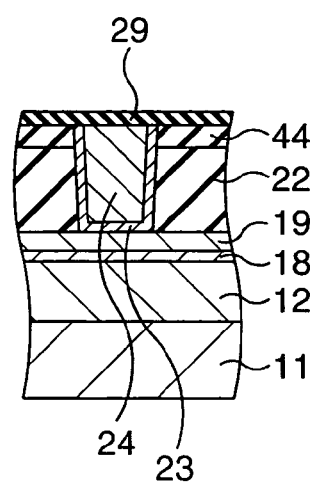

After that, as shown in FIGS. 42A and 42B, series of processing from the removal of the hard mask 33 to the recovery annealing are performed in the same manner as with the first embodiment.

Subsequently, as shown in FIGS. 43A and 43B and FIGS. 44A and 44B, series of processing from the formation of the alumina film 34 to the formation of the wiring 41 are performed in the same manner as with the first embodiment.

And a ferroelectric memory (not shown) is completed with series of processing after the formation of the further interlayer dielectric film in the same manner as with the first embodiment, although they are not shown in figures.

In the third embodiment as described above, the same effect as with the first embodiment is obtained. Also, according to the third embodiment, it is possible to more positively prevent the oxidation of the W plug 24. In the first embodiment, when the top electrode 32, the ferroelectric film 31 and the bottom electrode 30 are patterned at once and when the hard mask 33 is removed, the thickness of the W oxidation preventing insulating film 29 decreases and the remaining film thickness thereof is about 100 nm. In contrast, in the third embodiment, the SiON film 44 of 100 nm is further formed as the W oxidation preventing insulating film under the W oxidation preventing insulating film 29. Therefore, even when an amount of decrease in the thickness of the W oxidation preventing insulating film 29 increases, the plug 24 is not very apt to be oxidized during heat treatment after that.

Fourth Embodiment

Next, a fourth embodiment of the present invention will be described. FIGS. 45A and 45B to FIGS. 53A and 53B are sectional views that show, in order of step, a method of manufacturing a ferroelectric memory (semiconductor device) according to the fourth embodiment of the present invention. These figures each show a section perpendicular to the direction in which bit lines 3 extend. FIGS. 45A to 53A show the section of a memory cell array part of the ferroelectric memory, and FIG. 45B to 53B show the section of a logic part.

Figure 45A:
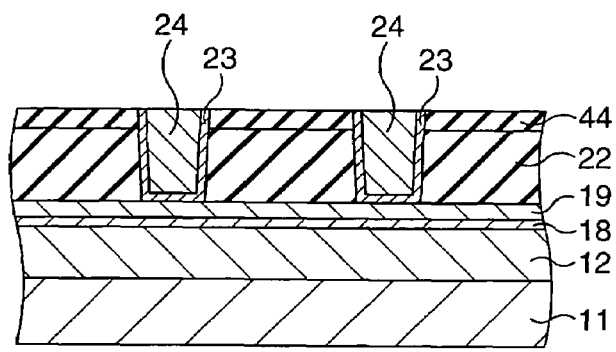
FIGS. 45A and 45B are each a sectional view that shows a method of manufacturing a ferroelectric memory according to a fourth embodiment of the present invention.
Figure 45B:
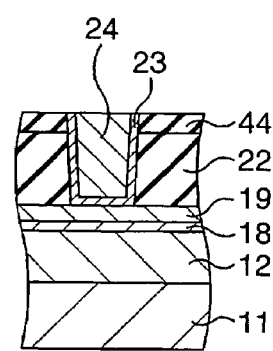

In the fourth embodiment, as shown in FIGS. 45A and 45B, series of processing from the formation of the well 12 to the formation of the W plug 24 are first performed.

Figure 46A:
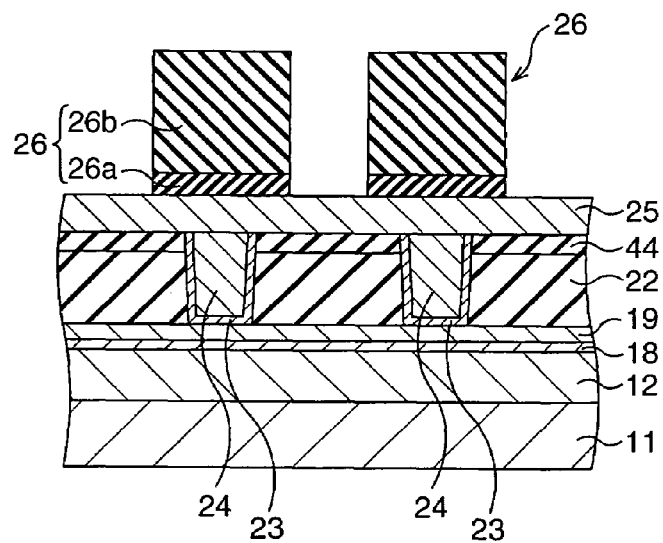
FIGS. 46A and 46B are each a sectional view that shows a method of manufacturing a ferroelectric memory in a step after the step shown in FIGS. 45A and 45B according to the fourth embodiment of the present invention.
Figure 46B:
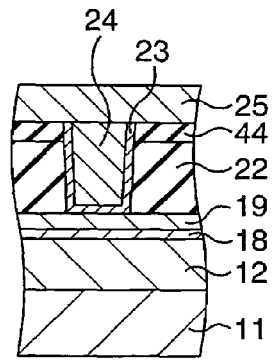

Next, as shown in FIGS. 46A and 46B, series of processing from the formation of the Ir film 25 to the formation of the hard mask 26 are performed in the same manner as with the first embodiment.

Figure 47A:
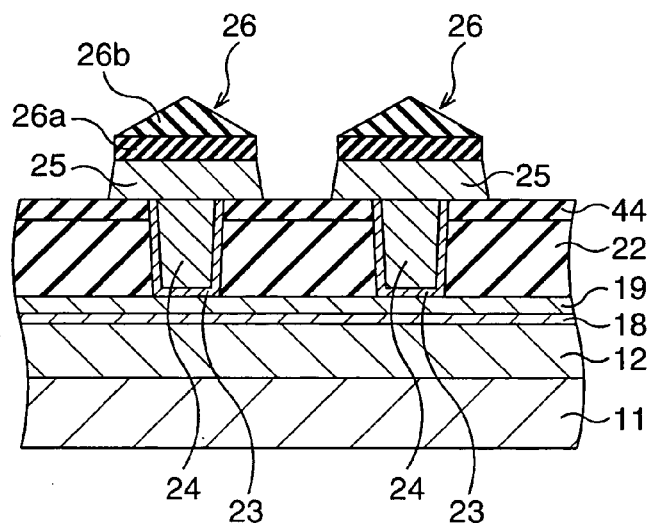
FIGS. 47A and 47B are each a sectional view that shows a method of manufacturing a ferroelectric memory in a step after the step shown in FIGS. 46A and 46B according to the fourth embodiment of the present invention.
Figure 47B:
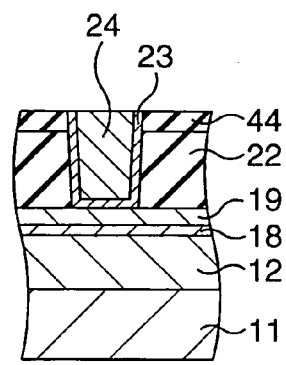

Subsequently, as shown in FIGS. 47A and 47B, the Ir film 25 is etched with using the hard mask 26 in the same manner as with the first embodiment.

Figure 48A:
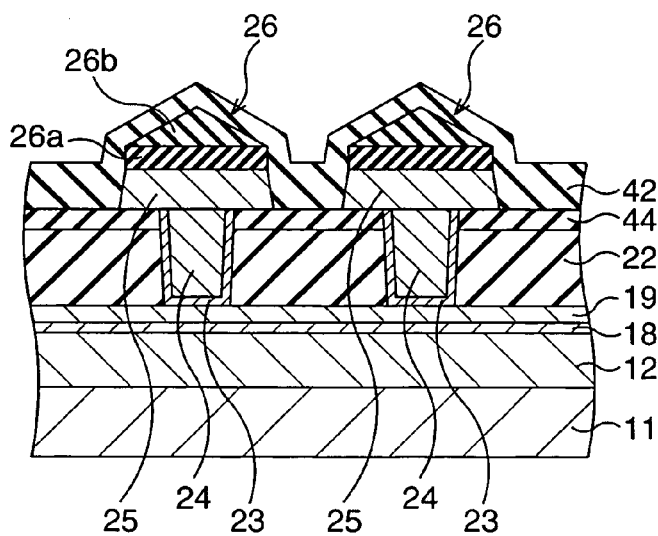
FIGS. 48A and 48B are each a sectional view that shows a method of manufacturing a ferroelectric memory in a step after the step shown in FIGS. 47A and 47B according to the fourth embodiment of the present invention.
Figure 48B:
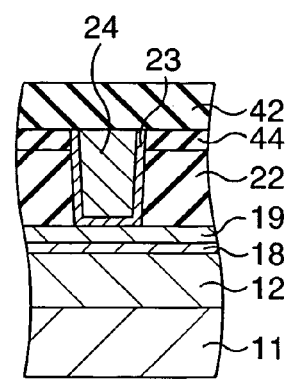

After that, as shown in FIGS. 48A and 48B, the SiON film 42 is formed as a W oxidation preventing insulating film on the whole surface by a HDP process, in the same manner as with the second embodiment.

Figure 49A:
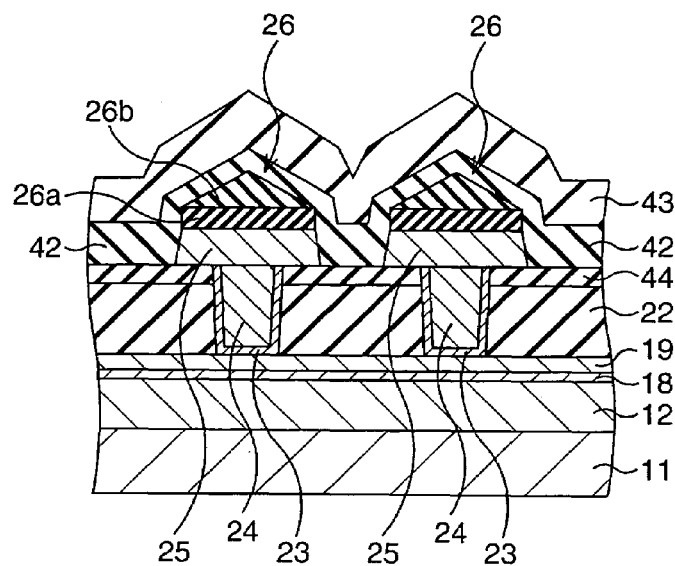
FIGS. 49A and 49B are each a sectional view that shows a method of manufacturing a ferroelectric memory in a step after the step shown in FIGS. 48A and 48B according to the fourth embodiment of the present invention.
Figure 49B:
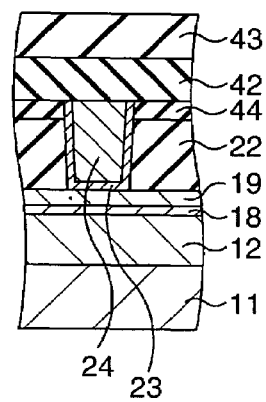

Subsequently, as shown in FIGS. 49A and 49B, the plasma TEOS film 43 is formed as a self-sacrificial film on the whole surface in the same manner as with the second embodiment.

Figure 50A:
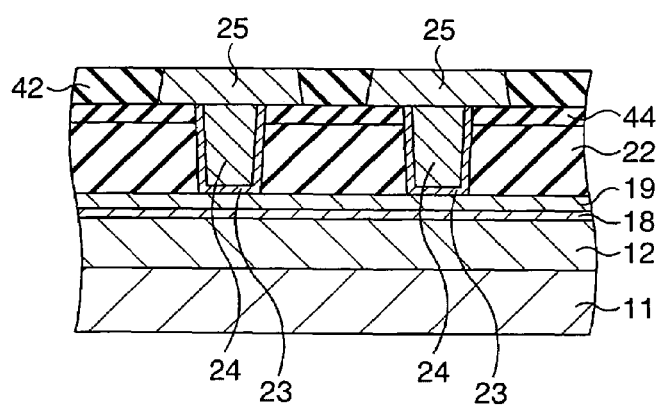
FIGS. 50A and 50B are each a sectional view that shows a method of manufacturing a ferroelectric memory in a step after the step shown in FIGS. 49A and 49B according to the fourth embodiment of the present invention.
Figure 50B:
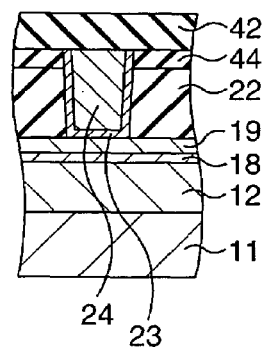

Next, as shown in FIGS. 50A and 50B, the plasma TEOS film (self-sacrificial film) 43, the SiON film (W oxidation preventing insulating film) 42, the hard mask 26 (the plasma TEOS film 26b and the TiN film 26a) and the Ir film 25 are polish ed by a CMP process.

Figure 51A:
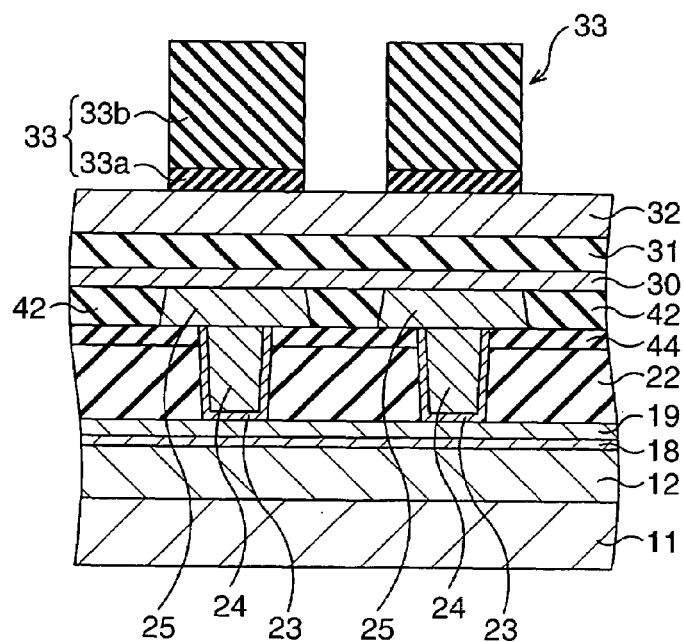
FIGS. 51A and 51B are each a sectional view that shows a method of manufacturing a ferroelectric memory in a step after the step shown in FIGS. 50A and 50B according to the fourth embodiment of the present invention.
Figure 51B:
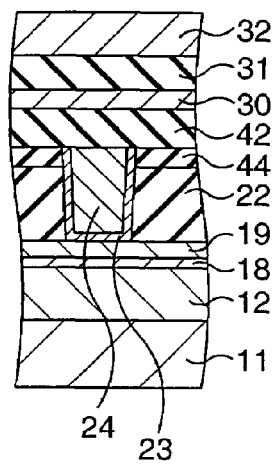

Subsequently, as shown in FIGS. 51A and 51B, series of processing from the formation of the bottom electrode film 30 to the formation of the hard mask 33 are performed in the same manner as with the first embodiment.

Figure 52A:
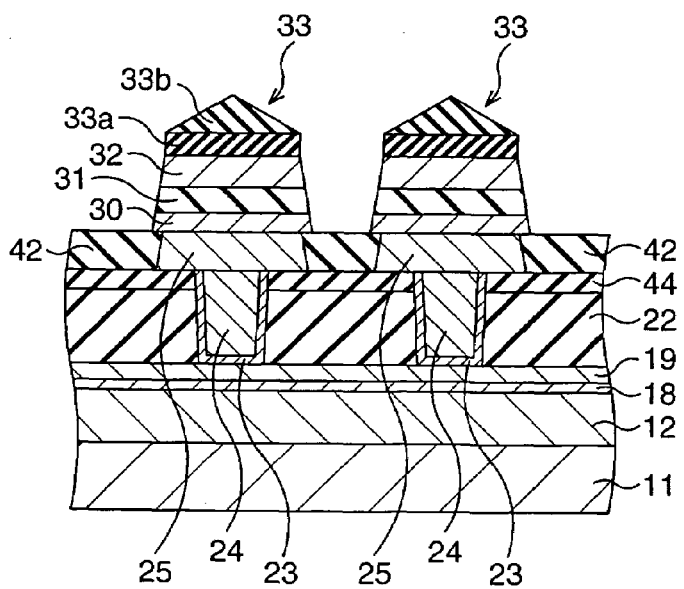
FIGS. 52A and 52B are each a sectional view that shows a method of manufacturing a ferroelectric memory in a step after the step shown in FIGS. 51A and 51B according to the fourth embodiment of the present invention.
Figure 52B:
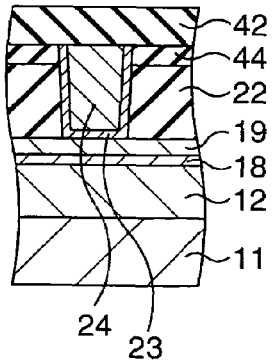

After that, as shown in FIGS. 52A and 52B, a ferroelectric capacitor of stack structure is formed by spontaneously processing the top electrode film 32, the ferroelectric film 31 and the bottom electrode film 30 in the same manner as with the first embodiment.

Subsequently, as shown in FIGS. 53A and 53B, series of processing from the removal of the hard mask 33 to the recovery annealing are performed in the same manner as with the first embodiment.

And a ferroelectric memory is completed with series of processing after the formation of the protective film in the same manner as with the first embodiment, although they are not shown in figures.

In this fourth embodiment as described above, the effects of the second embodiment and the effect of the third embodiment can be obtained.

Incidentally, in the first to fourth embodiments, the SiON film is used as a W oxidation preventing insulating film. However, in place of the SiON film, other insulating films such as an SiN film may be used.

Also, in CMP in which the surface of the W oxidation preventing barrier metal film is exposed, the W oxidation preventing barrier metal film itself is also polished and the thickness of the W oxidation preventing barrier metal film is also reduced. However, by ensuring that the thickness of the W oxidation preventing barrier metal film is kept at a desired thickness upon film formation thereof, polishing may be completed at the instant the surface of the W oxidation preventing barrier metal film is exposed.

INDUSTRIAL APPLICABILITY

As described in detail above, according to the present invention, it is possible to prevent voids from being generated in an insulating film for preventing oxidation of a contact plug. Therefore, it is possible to prevent the occurrence of cracks and slits that might be caused by the voids and it becomes possible to more suppress the arrival of oxygen at a contact plug.

What is claimed is:

1. A method of manufacturing a semiconductor device comprising the steps of:
    forming a switching element on a surface of a semiconductor substrate;
    forming an interlayer dielectric film covering the switching element;
    forming a contact hole that reaches a conductive layer of the switching element in the interlayer dielectric film;
    embedding a contact plug in the contact hole;
    forming a barrier metal film connected to the contact plug selectively on the interlayer dielectric film;
    forming a first insulating film on the whole surface;
    making a surface slope of the first insulating film gentler by performing sputter etching on the first insulating film; and
    forming a ferroelectric capacitor on the barrier metal film.

2. The method of manufacturing a semiconductor device according to claim 1, wherein the first insulating film is an SiON film or an SiN film.

3. The method of manufacturing a semiconductor device according to claim 1, further comprising the steps of, between the step of making a surface slope of the first insulating film gentler and the step of forming a ferroelectric capacitor:
    forming a second insulating film on the first insulating film in such a thickness that the total thickness of the second insulating film and the first insulating film becomes larger than the thickness of the barrier metal film; and
    making the total thickness of the first and second insulating films equal to the thickness of the barrier metal film by polishing at least the second insulating film and the first insulating film.

4. The method of manufacturing a semiconductor device according to claim 3, wherein, in the step of forming a first insulating film, the thickness of the first insulating film is made smaller than the thickness of the barrier metal film.

5. The method of manufacturing a semiconductor device according to claim 1, further comprising the step of, between the step of forming an interlayer dielectric film and the step of forming a contact hole, forming a third insulating film,
    wherein, in the step of forming a contact hole, the contact hole is formed in the interlayer dielectric layer and the third insulating film.

6. The method of manufacturing a semiconductor device according to claim 5, wherein the third insulating film is an SiON film or an SiN film.

7. The method of manufacturing a semiconductor device according to claim 1, wherein the barrier metal film is an Ir film.

8. The method of manufacturing a semiconductor device according to claim 1, wherein, in the step of making a surface slope of the first insulating film gentler, Ar gas is used as an etching gas.

9. The method of manufacturing a semiconductor device according to claim 3, wherein, in the step of making the total thickness of the first and second insulating films equal to the thickness of the barrier metal film, the total thickness of the first and second insulating films is not less than 350 nm.

10. The method of manufacturing a semiconductor device according to claim 1, wherein the contact plug is a W plug.

11. A method of manufacturing a semiconductor device comprising the steps of:
    forming a switching element on a surface of a semiconductor substrate;
    forming an interlayer dielectric film covering the switching element;
    forming a contact hole that reaches a conductive layer of the switching element in the interlayer dielectric film;
    embedding a contact plug in the contact hole;
    forming a barrier metal film connected to the contact plug selectively on the interlayer dielectric film;
    forming an insulating film thicker than the barrier metal film on the whole surface by a high-density plasma process; and
    forming a ferroelectric capacitor on the barrier metal film.

12. The method of manufacturing a semiconductor device according to claim 11, wherein the insulating film is an SiON film or an SiN film.

13. The method of manufacturing a semiconductor device according to claim 11, further comprising the step of, between the step of forming an insulating film and the step of forming a ferroelectric capacitor, making the thickness of the insulating film equal to the thickness of the barrier metal film by polishing at least the insulating film.

14. The method of manufacturing a semiconductor device according to claim 11, further comprising the steps of, between the step of forming an interlayer dielectric film and the step of forming a contact hole, forming a third insulating film on the interlayer dielectric film, wherein, in the step of forming a contact hole, the contact hole is formed in the interlayer dielectric film and the third insulating film.

15. The method of manufacturing a semiconductor device according to claim 14, wherein the third insulating film is an SiON film or an SiN film.

16. The method of manufacturing a semiconductor device according to claim 11, wherein the barrier metal film is an Ir film.

17. The method of manufacturing a semiconductor device according to claim 13, wherein, in the step of making the thickness of the insulating film equal to the thickness of the barrier metal film, the total thickness of the insulating film is not less than 350 nm.

18. The method of manufacturing a semiconductor device according to claim 11, wherein the contact plug is a W plug.

* * * * *

UNITED STATES PATENT AND TRADEMARK OFFICE
CERTIFICATE OF CORRECTION

PATENT NO.         : 7,297,558 B2                                      Page 1 of 1
APPLICATION NO.    : 11/106580
DATED              : November 20, 2007
INVENTOR(S)        : Ozaki et al.

It is certified that error appears in the above-identified patent and that said Letters Patent is hereby corrected as shown below:

Title Page

Please insert the following foreign application priority data on the cover page:

--      Related U.S. Application Data

(63)    Continuation of application No. PCT/JP2003/004264, filed on April 3, 2003 --

Signed and Sealed this

Twenty-seventh Day of May, 2008

JON W. DUDAS
*Director of the United States Patent and Trademark Office*